(12) United States Patent
Mochida et al.

(10) Patent No.: US 10,634,296 B2
(45) Date of Patent: Apr. 28, 2020

(54) LUMINOUS FLUX CONTROL MEMBER, LIGHT-EMITTING DEVICE, PLANAR LIGHT SOURCE DEVICE, AND DISPLAY DEVICE

(71) Applicant: Enplas Corporation, Saitama (JP)

(72) Inventors: Toshihiko Mochida, Saitama (JP); Hiroshi Takatori, Saitama (JP)

(73) Assignee: Enplas Corporation, Saitama (JP)

( * ) Notice: Subject to any disclaimer, the term of this patent is extended or adjusted under 35 U.S.C. 154(b) by 107 days.

(21) Appl. No.: 15/757,454

(22) PCT Filed: Aug. 29, 2016

(86) PCT No.: PCT/JP2016/075177
§ 371 (c)(1),
(2) Date: Mar. 5, 2018

(87) PCT Pub. No.: WO2017/038758
PCT Pub. Date: Mar. 9, 2017

(65) Prior Publication Data
US 2019/0024855 A1 Jan. 24, 2019

(30) Foreign Application Priority Data

Sep. 3, 2015 (JP) .................................. 2015-174013
Oct. 7, 2015 (JP) .................................. 2015-199459

(51) Int. Cl.
*G02B 3/00* (2006.01)
*F21V 5/04* (2006.01)
(Continued)

(52) U.S. Cl.
CPC ................ *F21S 2/005* (2013.01); *F21V 5/04* (2013.01); *G02B 3/0006* (2013.01);
(Continued)

(58) Field of Classification Search
CPC ... F21V 5/00; F21V 5/04; F21S 2/005; G02B 19/0028; G02B 19/0071; G02B 3/0006
See application file for complete search history.

(56) References Cited

U.S. PATENT DOCUMENTS 8,251,547 B2 * 8/2012 Yamaguchi .............. G02B 3/04
362/307
8,967,833 B2 * 3/2015 Wang ........................ F21V 5/04
359/708
(Continued)

FOREIGN PATENT DOCUMENTS

JP 2008/211221 A 9/2008
JP 2011-023204 A 2/2011
(Continued)

OTHER PUBLICATIONS

International Search Report from International Application No. PCT/JP2016/075177 dated Nov. 29, 2016.

*Primary Examiner* — Karabi Guharay
(74) *Attorney, Agent, or Firm* — Brundidge & Stanger, P.C.

(57) ABSTRACT

This luminous flux control member has: a plane of incidence having a first incidence plane and a second incidence plane; an emission plane; and a second concavity. The luminous flux control member satisfies the expression h1<h2+d×cot(θ1+θ2), where h1 is the space between the apex of the second concavity and a second imaginary line orthogonal to the center axis and that passes through the aperture edge portion, h2 is the space between the second imaginary line and the incidence position of light on the second incidence plane, d is the distance between the incidence position and the apex in the direction orthogonal to the center axis, θ1 is the angle of refraction of light in the incidence position, and
(Continued)

θ2 is the angle of the tangent line at the incidence position in relation to the second imaginary line.

7 Claims, 26 Drawing Sheets

(51) Int. Cl.
- *F21S 2/00* (2016.01)
- *H01L 33/60* (2010.01)
- *G02B 19/00* (2006.01)
- *F21Y 115/10* (2016.01)
- *H01L 33/58* (2010.01)

(52) U.S. Cl.
CPC ..... *G02B 19/0028* (2013.01); *G02B 19/0061* (2013.01); *H01L 33/60* (2013.01); *F21Y 2115/10* (2016.08); *H01L 33/58* (2013.01)

(56) References Cited

U.S. PATENT DOCUMENTS

| | | |
|---|---|---|
| 2008/0205058 A1 | 8/2008 | Park et al. |
| 2009/0052192 A1* | 2/2009 | Kokubo ............... F21V 5/048 362/311.09 |
| 2015/0211713 A1 | 7/2015 | Takatori et al. |
| 2015/0260371 A1 | 9/2015 | Takatori |
| 2016/0281957 A1* | 9/2016 | Fujii ..................... F21V 5/04 |

FOREIGN PATENT DOCUMENTS

| | | |
|---|---|---|
| JP | 2014-063718 A | 4/2014 |
| JP | 2014-102485 A | 6/2014 |
| WO | 2014/024681 A1 | 2/2014 |

\* cited by examiner

LUMINOUS FLUX CONTROL MEMBER, LIGHT-EMITTING DEVICE, PLANAR LIGHT SOURCE DEVICE, AND DISPLAY DEVICE

TECHNICAL FIELD

The present invention relates to a light flux controlling member that controls a distribution of light emitted from a light emitting element, and to a light-emitting device, a surface light source device and a display device including the light flux controlling member.

BACKGROUND ART

Some transmission type image display apparatuses such as liquid crystal display apparatuses use a direct surface light source device as a backlight. In recent years, direct surface light source devices having a plurality of light emitting elements as the light source have been used.

For example, a direct surface light source device includes a substrate, a plurality of light emitting elements, a plurality of light flux controlling members (lenses) and a light diffusion member. Each of the light emitting elements is, for example, a light-emitting diode (LED) such as a white light-emitting diode. The light emitting elements are disposed on the substrate in a matrix. The light flux controlling member that spreads the light of the light emitting element in the surface direction of the substrate is disposed over each light emitting element. The light emitted from the light flux controlling member is diffused by the light diffusion member so as to illuminate an illumination member (for example, a liquid crystal panel) in a planar fashion.

FIGS. 1A to 1C illustrate a configuration of a conventional light flux controlling member. FIG. 1A is a perspective view as viewed from a rear side, FIG. 1B is a perspective view illustrating a cross-section as viewed from a rear side, and FIG. 1C is a sectional view. It is to be noted that, in FIGS. 1A and 1B, a leg part disposed on the rear side is omitted. As illustrated in FIGS. 1A to 1C, conventional light flux controlling member 20 includes incidence surface 22 and emission surface 24. Incidence surface 22 is an inner surface of a first recess that is formed on the rear surface and disposed opposite to a light-emitting element. Incidence surface 22 allows incidence of light emitted from light-emitting element. Emission surface 24 is disposed on the side opposite to incidence surface 22, and configured to emit, to the outside, light incident on incidence surface 22.

FIGS. 2A and 2B illustrate light paths of light flux controlling member 20. FIG. 2A illustrates light paths of light beams emitted from a center of a light emission surface of light emitting element 10 at an emission angle of 30 degrees, and FIG. 2B illustrates light paths of light beams emitted from a center of a light emission surface of light emitting element 10 at an emission angle of 40 degrees. Here, the "emission angle" is an angle (θ in FIG. 2A) of a light beam to optical axis OA of light emitting element 10. It is to be noted that the leg part disposed on the rear side is omitted in FIGS. 2A and 2B.

As illustrated in FIGS. 2A and 2B, light emitted from light emitting element 10 enters light flux controlling member 20 from incidence surface 22. The light entering light flux controlling member 20 reaches emission surface 24. A large part of the light reaching emission surface 24 is emitted to the outside from emission surface 24 (solid line arrow). At this time, when emitted from emission surface 24, the light is refracted by emission surface 24, while the travelling direction thereof is controlled. On the other hand, another part of the light reaching emission surface 24 is reflected by light emission surface 24 (fresnel reflection), and reaches rear surface 26 (broken line arrow). When a part of the light reaching rear surface 26 is internally reflected at rear surface 26, the quantity of the light travelling toward a portion immediately above light flux controlling member 20 is excessively increased, and consequently non-uniform luminance distribution (luminance unevenness) of the light applied from the light-emitting device is caused. In addition, when the light reaching rear surface 26 is emitted from rear surface 26, the emission light is absorbed by the substrate, and consequently the use efficiency of light is reduced. In view of this, PTL 1 proposes a light flux controlling member for solving the above-mentioned problems.

FIGS. 3A to 3C illustrate a configuration of light flux controlling member 30 disclosed in PTL 1. FIG. 3A is a perspective view as viewed from a rear side, FIG. 3B is a perspective view illustrating a cross section as viewed from a rear side, and FIG. 3C is a sectional view. It is to be noted that the leg part disposed on the rear side is omitted in FIGS. 3A and 3B. As illustrated in FIGS. 3A to 3C, in light flux controlling member 30 disclosed in PTL 1, a second recess is formed on rear surface 26. The second recess includes inclined surface 32 disposed on the outer side, and surface 34 disposed on the inner side in substantially parallel to central axis CA. Inclined surface 32 is rotationally symmetrical (circularly symmetrical) about central axis CA of light flux controlling member 30, and is tilted at a predetermined angle (for example, 45 degrees) to a virtual straight-line orthogonal to central axis CA.

FIGS. 4A and 4B illustrate light paths of light flux controlling member 30. FIG. 4A illustrates light paths of light beams emitted from a center of a light emission surface of light emitting element 10 at an emission angle of 30 degrees, and FIG. 4B illustrates light paths of light beams emitted from a center of a light emission surface of light emitting element 10. It is to be noted that the leg part disposed on the rear side is omitted also in FIGS. 4A and 4B. As illustrated in FIGS. 4A and 4B, light internally reflected at emission surface 24 reaches a predetermined portion of rear surface 26. By forming inclined surface 32 in the above-mentioned predetermined region, it is possible to reflect at least a part of the light reaching inclined surface 32 toward the light lateral direction.

In this manner, in light flux controlling member 30 disclosed in PTL 1, light internally reflected at emission surface 24 is not easily directed toward a portion immediately above light flux controlling member 30, and is not easily absorbed by the substrate. Accordingly, a light-emitting device having light flux controlling member 30 disclosed in PTL 1 can uniformly and efficiently emit light in comparison with a conventional light-emitting device having light flux controlling member 20.

In addition, in recent years, LEDs of chip-on-board (COB) type have been used as the light source of illumination apparatuses because of its ease of mounting, and its high light emission efficiency. The LEDs of COB type are known to emit a larger quantity of light also in the lateral direction in addition to the light emission in the upward direction, in comparison with conventional LEDs.

CITATION LIST

Patent Literature

PTL 1
Japanese Patent Application Laid-Open No. 2011-23204

SUMMARY OF INVENTION

Technical Problem

In the case where an LED of COB type is used as the light-emitting element of the surface light source device disclosed in PTL 1, the light flux controlling member might be disposed such that the rear surface of the light flux controlling member is lower than the top surface of the light-emitting element, for the purpose of allowing a large quantity of light which is emitted in the lateral direction of the LED to enter the light flux controlling member from incidence surface 22. In this case, the light which is emitted in the lateral direction of the light-emitting element, and enters the light flux controlling member from a lower portion of the incidence surface 22 travels inside the light flux controlling member, and reaches inner surface 34 of the second recess. This light passes through inner surface 34 while, depending on the state of surface 34, being scattered. Further, most of the light passing through surface 34 is refracted by inclined surface 32, so as to travel toward a region near an upper region of the light flux controlling member (see FIG. 5). In this manner, in the case where an LED of COB type is used in the surface light source device disclosed in PTL 1, the quantity of the light travelling toward the region near the upper region of the light-emitting device is excessive due to scattering at inner surface 34 and refraction at inclined surface 32, and consequently a circular high luminance region is formed near the upper region of the light flux controlling member, thus causing luminance unevenness. In addition, even in the case where the rear surface of the light flux controlling member is disposed at a position higher than the top surface of the light-emitting element, the light incident on a part in the proximity of the outer edge of the first recess might be refracted and might reach inner surface 34 of the second recess.

An object of the present invention is to provide a light flux controlling member that causes less luminance unevenness of light emitted from the light flux controlling member even in the case where the light flux controlling member is used together with a light-emitting element such as an LED of COB type that emits a large quantity of light in the lateral direction, and even in the case where a recess is formed at a position where light travelling in the light flux controlling member at a large angle with respect to the optical axis easily reaches.

In addition, another object of the present invention is to provide a light-emitting device, a surface light source device and a display device including the light flux controlling member.

Solution to Problem

A light flux controlling member according to embodiments of the present invention controls a distribution of light emitted from a light-emitting element, the light flux controlling member includes: an incidence surface that is an inner surface of a first recess, the first recess being disposed on a rear side of the light flux controlling member so as to intersect a central axis of the light flux controlling member, the incidence surface being configured to allow incidence of light emitted from the light-emitting element; an emission surface disposed on a front side of the light flux controlling member so as to intersect the central axis, the emission surface being configured to emit, to outside, light incident on the incidence surface; and a second recess disposed on the rear side so as to surround the incidence surface. The incidence surface includes a first incidence surface disposed so as to intersect the central axis, and a second incidence surface disposed so as to connect an outer edge of the first incidence surface and an opening edge of the first recess, in a cross section including the central axis, an intersection of the first incidence surface and the second incidence surface is disposed on the central axis side relative to the opening edge of the first recess, in the cross-section, an inclination angle of a tangent to an end portion of the second incidence surface on the first incidence surface side with respect to a first virtual line that is orthogonal to the central axis is smaller than an inclination angle of a tangent to an end portion of the first incidence surface on the second incidence surface side with respect to the first virtual line, and the light flux controlling member satisfies the following Expression (1):

[Expression 1]

$$h1 < h2 + d \times \cot(\theta 1 + \theta 2) \qquad (1)$$

where: h1 represents a distance between an apex of the second recess and a second virtual line that is orthogonal to the central axis and passes through the opening edge of the first recess in the cross-section, h2 represents a distance between the second virtual line and an incident position of light which is emitted from the light-emitting element and is incident on the second incidence surface in the cross-section, d represents a distance between the incident position and the apex of the second recess in a direction orthogonal to the central axis in the cross-section, θ1 represents a refraction angle of the light incident on the incident position, and θ2 represents an inclination angle of a tangent to the incident position with respect to the second virtual line in the cross-section.

A light-emitting device according to embodiments of the present invention includes: a light-emitting element; and the light flux controlling member in which the light flux controlling member is disposed at a position where the central axis coincides with an optical axis of the light-emitting element.

A surface light source device according to embodiments of the present invention includes: a substrate; a plurality of the light-emitting devices according to claim 5 or 6 that are disposed on the substrate at a predetermined interval; and a light diffusion plate disposed in approximately parallel with the substrate at a position above the plurality of light-emitting devices, the light diffusion plate being configured to allow light from the plurality of light-emitting devices to pass through the light diffusion plate while diffusing the light. In an angle range from a direction along the optical axis to a direction in which light having a highest luminous intensity is emitted from each of the plurality of light-emitting devices, a luminous intensity of light from the each of the plurality of light-emitting devices gradually increases as an angle to the optical axis increases, and the surface light source device satisfies the following Expression (2), Expression (3) and Expression (4):

[Expression 2]

$$\frac{H}{P} \leq 0.2 \quad (2)$$

[Expression 3]

$$\frac{L}{P} > 1 \quad (3)$$

[Expression 4]

$$\frac{I_{1/2}}{I_0} > 6 \quad (4)$$

where P represents a center-to-center distance of the plurality of light-emitting devices, H represents a distance between a top surface of the substrate and a bottom surface of the light diffusion plate, L represents a distance between an arrival point of the light having the highest luminous intensity on the bottom surface of the light diffusion plate, and an intersection of the optical axis and the bottom surface of the light diffusion plate, $I_0$ represents a luminous intensity of light emitted from the each of the plurality light-emitting devices in a direction of the light axis, and $I_{1/2}$ represents a luminous intensity of light emitted from the each of the plurality light-emitting devices toward a point, on the bottom surface of the light diffusion plate, distanced by P/2 from the intersection of the optical axis and the bottom surface of the light diffusion plate.

A display device according to embodiments of the present invention includes: the surface light source device; and an illumination member configured to be irradiated with light emitted from the surface light source device.

Advantageous Effects of Invention

The light flux controlling member of the embodiments of the present invention causes less luminance unevenness of emission light even when the light flux controlling member is used together with a light-emitting element such as an LED of COB type that emits a large quantity of light in the lateral direction.

In addition, the light-emitting device, the surface light source device and the display device of the embodiments of the present invention include the above-mentioned light flux controlling member that cause less luminance unevenness, and therefore cause less luminance unevenness of emission light.

DESCRIPTION OF EMBODIMENTS

In the following, a light flux controlling member, a light-emitting device, a surface light source device and a display device of embodiments of the present invention are described in detail with reference to the accompanying drawings. In the following description, as a typical example of the surface light source device according to the embodiments of the present invention, a surface light source device suitable for a backlight of a liquid crystal display apparatus will be described. When used with a member (for example, a liquid crystal panel) configured to be irradiated with light from the surface light source device, the surface light source device can be used as a display apparatus.

(Embodiment 1)

(Configurations of Surface Light Source Device and Light-emitting Device)

Figure 6A:
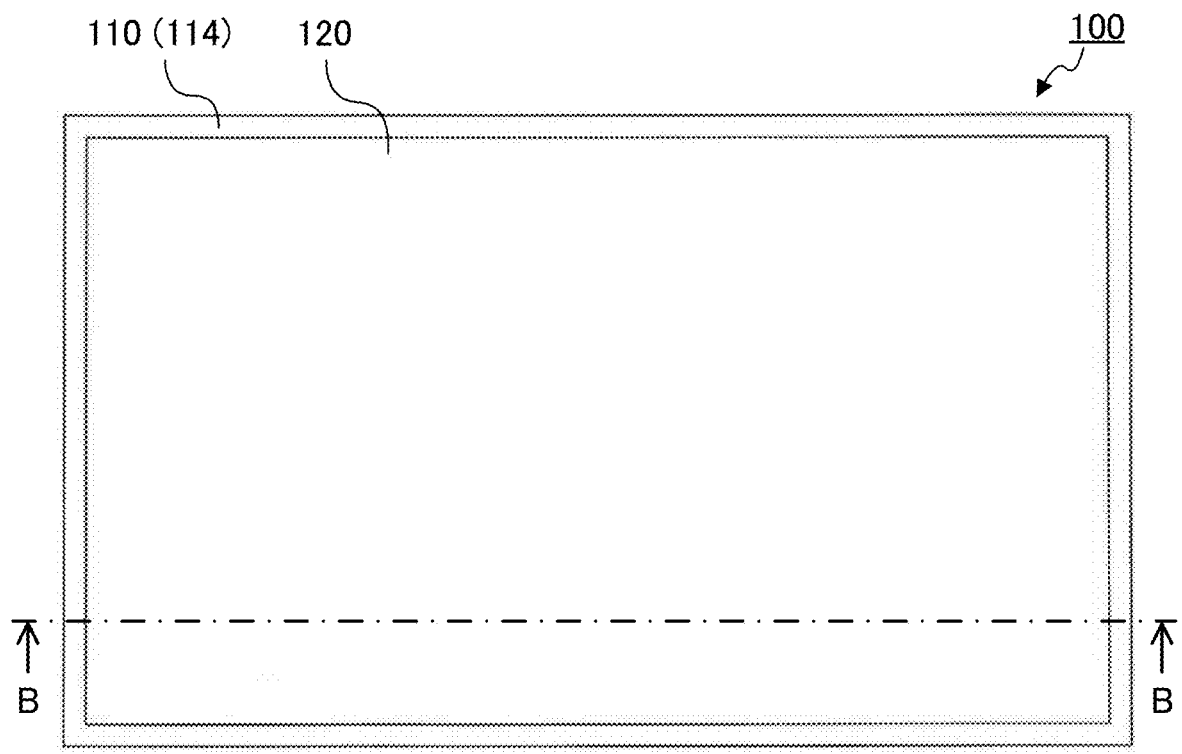
FIGS. 6A and 6B illustrate a configuration of a surface light source device according to Embodiment 1.
Figure 6B:
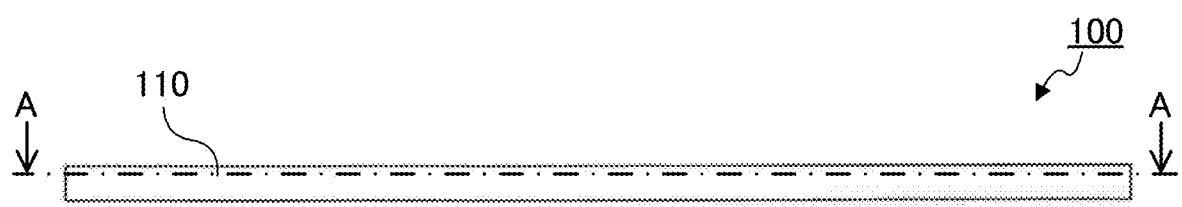
Figure 7A:
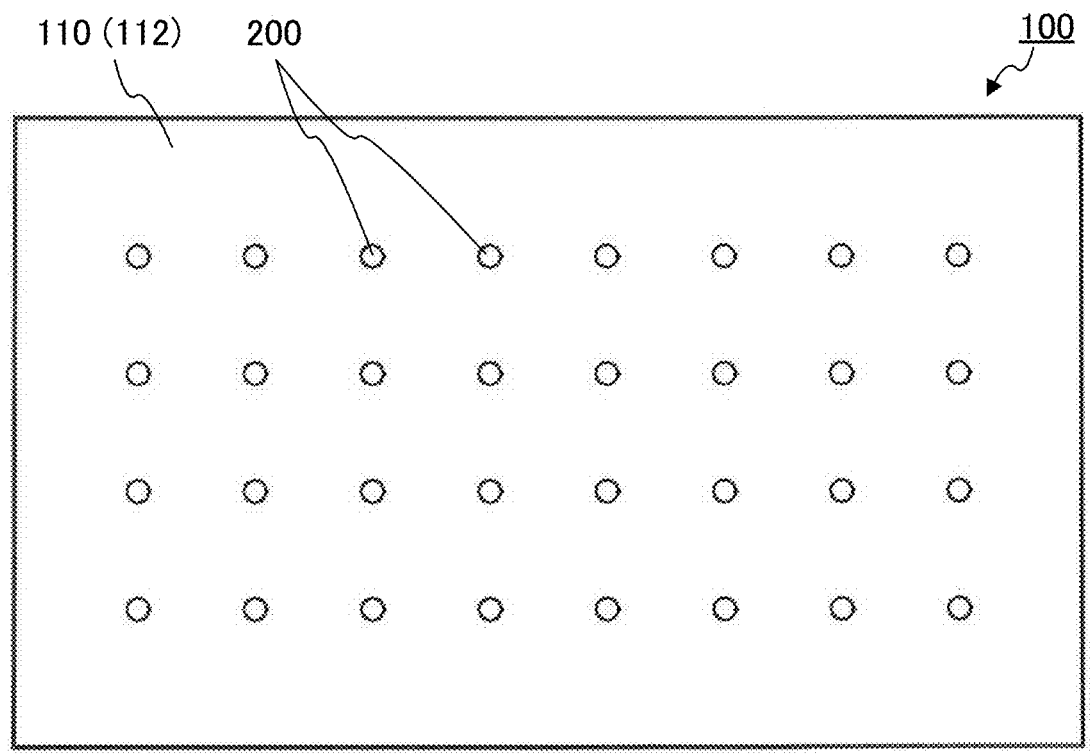
FIGS. 7A and 7B are sectional views illustrating a configuration of the surface light source device according to Embodiment 1.
Figure 7B:
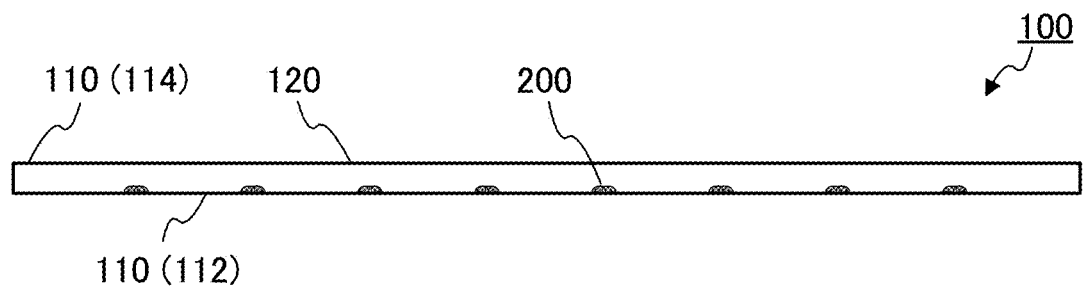
Figure 8:
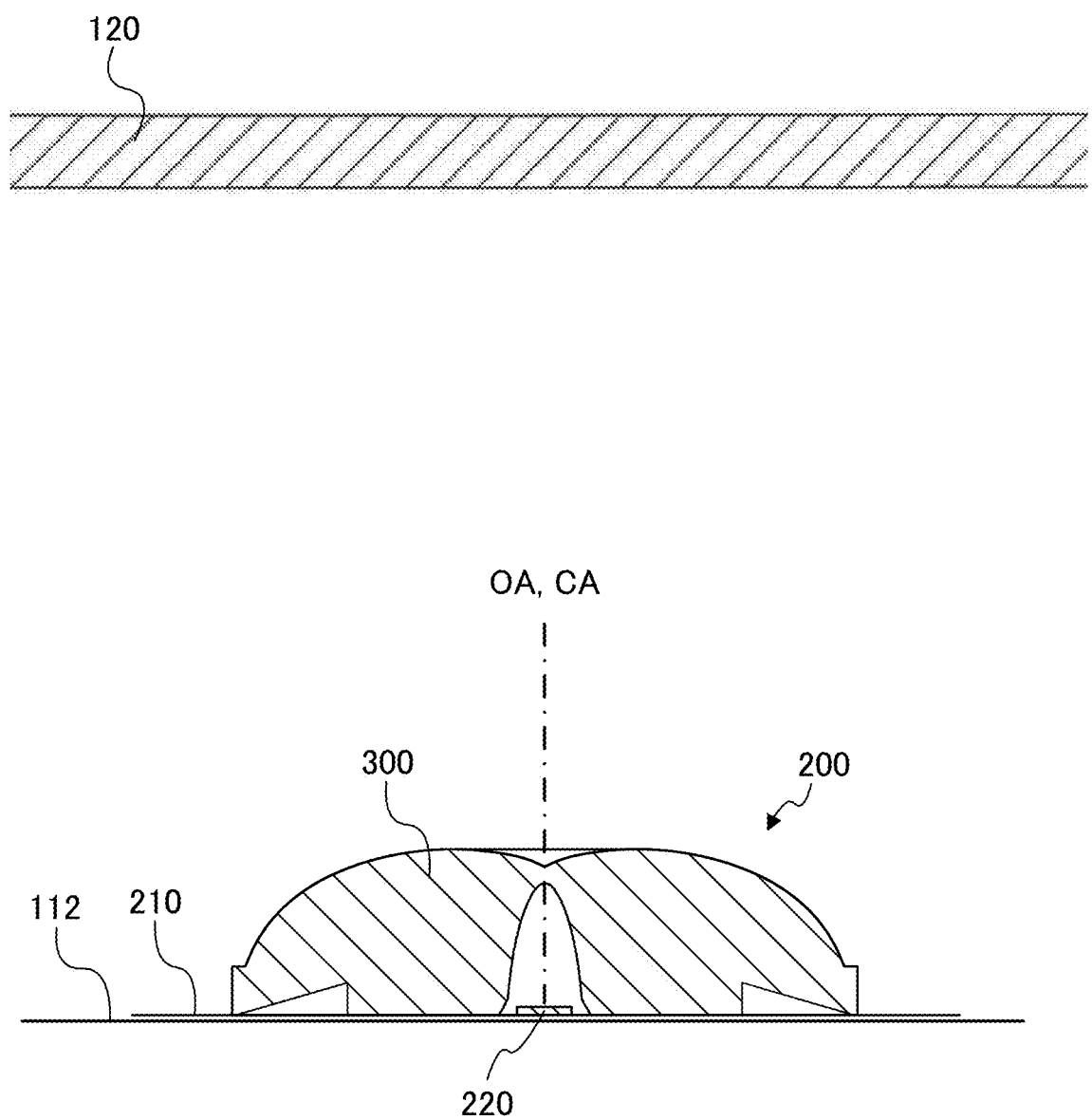
FIG. 8 is a partially enlarged sectional view of the surface light source device according to Embodiment 1.

FIGS. 6A to 8 illustrate a configuration of surface light source device 100 according to Embodiment 1 of the present invention. FIG. 6A is a plan view of surface light source device 100 according to Embodiment 1, and FIG. 6B is a front view of surface light source device 100. FIG. 7A is a sectional view taken along line A-A of FIG. 6B, and FIG. 7B is a sectional view taken along line B-B of FIG. 6A. FIG. 8 is a partially enlarged sectional view of surface light source device 100.

As illustrated in FIGS. 6A to 7B, surface light source device 100 includes casing 110, a plurality of light-emitting devices 200, and light diffusion plate 120. Light-emitting devices 200 are disposed in a matrix on substrate 210 on bottom plate 112 of casing 110. The inner surface of bottom plate 112 functions as a diffusive reflection surface. In addition, top plate 114 of casing 110 is provided with an opening. Light diffusion plate 120 is disposed to cover the opening, and functions as a light emitting surface. The light emitting surface may have a size of, for example, approximately 400 mm×approximately 700 mm. The center-to-center distance (pitch) of light-emitting devices 200 is P (mm), and the distance (height) between the top surface of substrate 210 and the bottom surface of light diffusion plate 120 is H (mm)(see FIG. 13). For example, surface light source device 100 according to the present embodiment satisfies Expression (2).

[Expression 5]

$$\frac{H}{P} \leq 0.2 \quad (2)$$

A plurality of light-emitting devices 200 are disposed on substrate 210 at a predetermined interval. A plurality of substrates 210 are fixed at respective predetermined positions on bottom plate 112 of casing 110. As illustrated in FIG. 8, each light-emitting device 200 includes light emitting element 220 and light flux controlling member 300.

Light emitting element 220 is a light source of surface light source device 100, and is mounted on substrate 210. Light emitting element 220 is a light-emitting diode (LED) such as a white light-emitting diode, for example. Preferably, in the present embodiment, light emitting element 220 is an LED of chip-on-board (COB) type from the viewpoint of the ease of mounting and high light emission efficiency.

LEDs of COB type are known to emit a greater quantity of light in the lateral direction in comparison with conventional LEDs. Light-emitting element 220 of an LED of COB type or the like emits a large quantity of light in the lateral direction, and it is therefore necessary to control the light such that a larger quantity of light emitted in the lateral direction from light-emitting element 220 enters light flux controlling member 300. In view of this, it is preferable that the top surface of light-emitting element 220 be disposed above the lower end (opening edge) of first recess 310 described later in the vertical direction.

Light flux controlling member 300 is a lens, and fixed on substrate 210. Light flux controlling member 300 controls a distribution of light emitted from light emitting element 220, and spreads the light travelling direction in the plane direction of the substrate. Light flux controlling member 300 is disposed over light emitting element 220 in such a manner that its central axis CA matches optical axis OA of light emitting element 220 (see FIG. 8). It is to be noted that each of incidence surface 320 and emission surface 330 of light flux controlling member 300 described later is rotationally symmetrical (circularly symmetrical), and the rotational axes thereof coincide with each other. The rotational axes of incidence surface 320 and emission surface 330 are referred to as "central axis CA of light flux controlling member." In addition, "optical axis OA of light emitting element" refers to a central light beam of a stereoscopic light flux from light emitting element 220.

Light flux controlling member 300 can be formed by integral molding. The material of light flux controlling member 300 is not limited as long as light of a desired wavelength can pass therethrough. For example, the material of light flux controlling member 100 is an optically transparent resin such as polymethylmethacrylate (PMMA), polycarbonate (PC), epoxy resin (EP); and silicone resin, or glass. A main feature of surface light source device 100 according to the present embodiment is the configuration of light flux controlling member 300. Therefore, light flux controlling member 300 will be separately described in detail.

Light diffusion plate 120 is a plate-shaped member having a light diffusing property, and allows the light emitted from light-emitting device 200 to pass therethrough while diffusing the light. Light diffusion plate 120 is disposed over light-emitting devices 200 and is approximately parallel with substrate 210. Normally, the size of light diffusion plate 120 is substantially the same as that of the member to be irradiated such as a liquid crystal panel. For example, light diffusion plate 120 is formed of an optically transparent resin such as polymethylmethacrylate (PMMA), polycarbonate (PC), polystyrene (PS), and styrene methyl methacrylate copolymerization resin (MS). In order to provide a light diffusing property, minute irregularities are formed on the surface of light diffusion plate 120, or diffusing members such as beads are dispersed in light diffusion plate 120.

In surface light source device 100 according to the embodiment of the present invention, the light emitted from light emitting elements 220 is spread by respective light flux controlling members 300 so as to illuminate a wide range of light diffusion plate 120. The light emitted from each light flux controlling member 300 is further diffused by light diffusion plate 120. As a result, surface light source device 100 according to the embodiment of the present invention can uniformly illuminate a planar member (for example, a liquid crystal panel).

(Configuration of Light Flux Controlling Member)

Figure 9A:
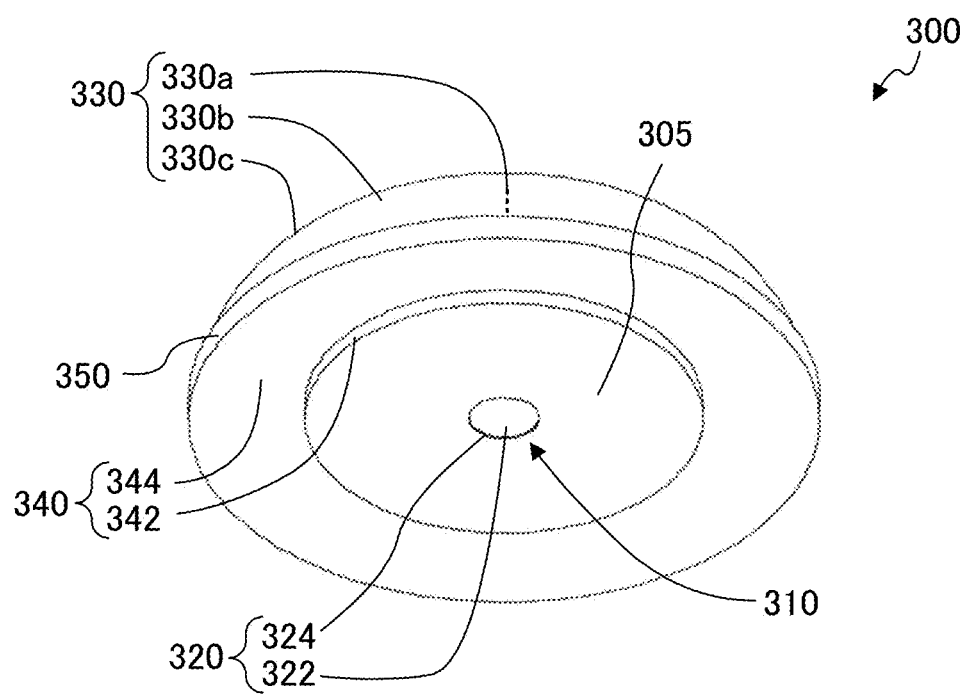
FIGS. 9A and 9B are perspective views of a light flux controlling member according to Embodiment 1 as viewed from a rear side.
Figure 9B:
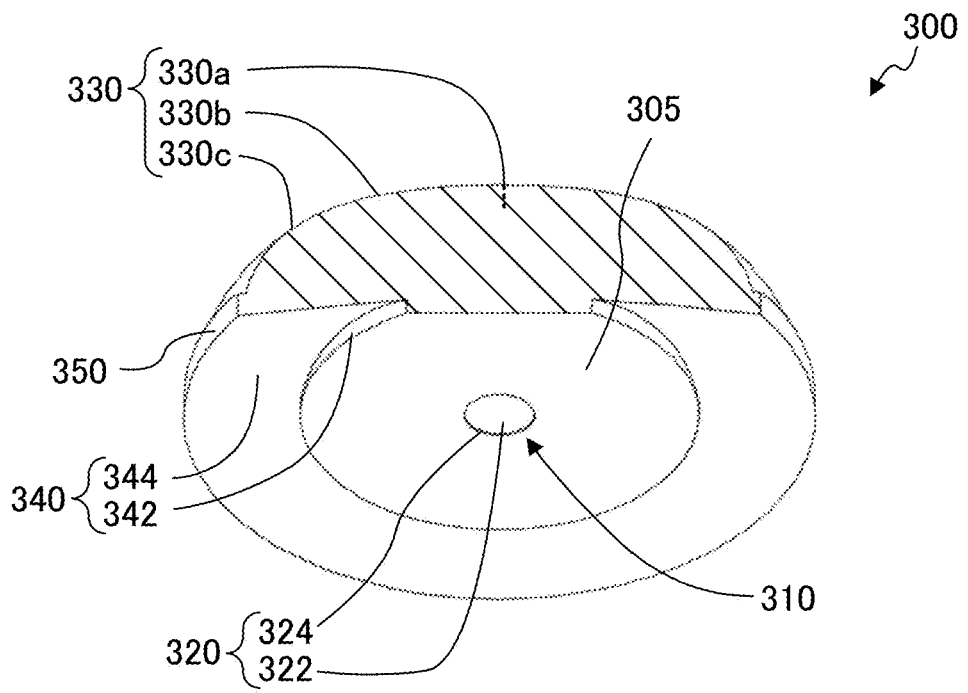
Figure 10A:
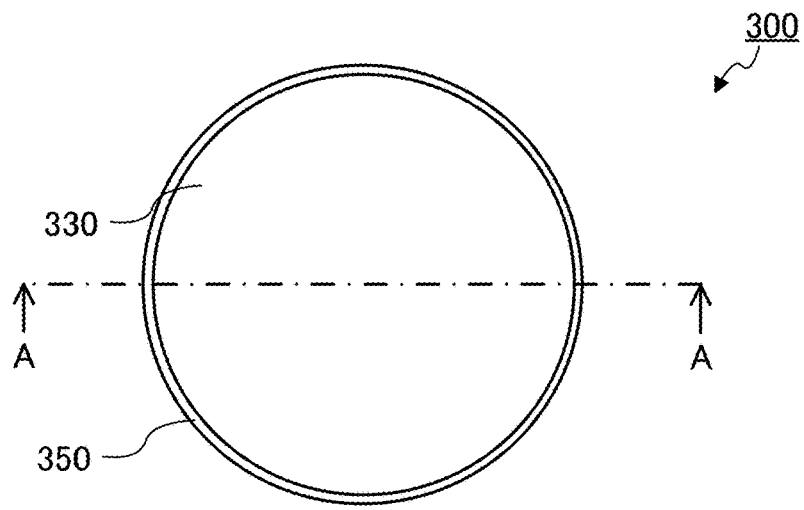
FIGS. 10A to 10C illustrate a configuration of the light flux controlling member according to Embodiment 1.
Figure 10B:
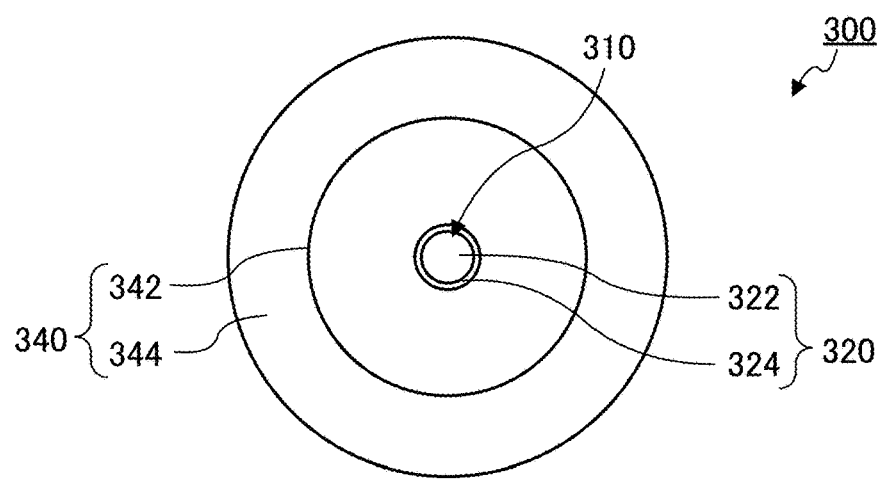
Figure 10C:
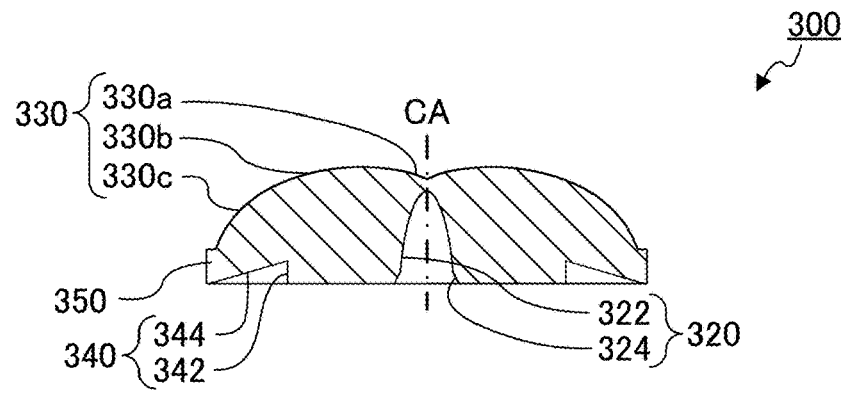

FIGS. 9A to 10C illustrate a configuration of light flux controlling member 300 according to Embodiment 1. FIGS. 9A and 9B are perspective views of light flux controlling member 300 as viewed from the rear side (substrate 210 side). FIG. 10A is a plan view of light flux controlling member 300, FIG. 10B is a bottom view of light flux controlling member 300, and FIG. 10C is a sectional view taken along line A-A of FIG. 10A.

As illustrated in FIGS. 9A to 10C, light flux controlling member 300 includes incidence surface 320 as the inner surface of first recess 310, emission surface 330, and second recess 340. In addition, in the present embodiment, light flux controlling member 300 includes flange part 350 for easy handling of light flux controlling member 300. Further, light flux controlling member 300 may include a leg part (omitted in the drawing) intended to define a gap for dissipating the heat generated by light-emitting element 220, and to position and fix light flux controlling member 300 to substrate 210.

First recess 310 is disposed at a center portion of rear surface 305 so as to intersect central axis CA of light flux controlling member 300. First recess 310 is disposed so as to intersect optical axis OA of light-emitting element 220 (central axis CA of light flux controlling member 300). The inner surface of first recess 310 functions as incidence surface 320. That is, incidence surface 320 is disposed so as to intersect central axis CA. Incidence surface 320 allows a large part of the light emitted from light-emitting element 220 to enter light flux controlling member 300, while controlling the travelling direction of the light. Incidence surface 320 intersects central axis CA of light flux controlling member 300, and is substantially rotationally symmetrical (circularly symmetrical) about central axis CA. Incidence surface 320 includes first incidence surface 322, and second incidence surface 324.

First incidence surface 322 is disposed on the bottom side of first recess 310 so as to intersect central axis CA. First incidence surface 322 allows the light emitted from light-emitting element 220 which has a small emission angle (light emitted from mainly from the top surface of light-emitting element 220) to enter light flux controlling member 300. First incidence surface 322 may be composed of one surface, or a plurality of surfaces. In the present embodiment, first incidence surface 322 is composed of one surface. In addition, first incidence surface 322 is rotationally symmetrical (circularly symmetrical) about central axis CA. First incidence surface 322 is formed such that, in the cross section including central axis CA, the distance thereof from central axis CA increases toward rear surface 305. To be more specific, first incidence surface 322 is formed in a temple-bell shape.

Second incidence surface 324 is disposed on the opening side of first recess 310 so as to connect the outer edge of first incidence surface 322 and the opening edge of first recess 310. Second incidence surface 324 allows, to enter light flux controlling member 300, light (light emitted mainly from the side surface of light-emitting element 220) having an emission angle larger than that of the light which enters light flux controlling member 300 from first incidence surface 322. In the cross section including central axis CA, the intersection of first incidence surface 322 and second incidence surface 324 is disposed on central axis CA side relative to the opening edge of first recess 310.

In the cross section including central axis CA, the inclination angle of the tangent to the end portion of second incidence surface 324 on first incidence surface 322 side with respect to a first virtual line orthogonal to central axis CA is smaller than the inclination angle of the tangent to the end portion of first incidence surface 322 on second incidence surface 324 side with respect to the first virtual line. Here, the "inclination angle" means the smaller angle of the angles between two straight lines. In the present embodiment, "the inclination angle of the tangent to the end portion of second incidence surface 324 on first incidence surface 322 side with respect to the first virtual line orthogonal to central axis CA" means the smaller angle of the angles between the tangent to the end portion of second incidence surface 324 on first incidence surface 322 side, and the first virtual line orthogonal to central axis CA. In addition, "the inclination angle of the tangent to the end portion of first incidence surface 322 on second incidence surface 324 side with respect to the first virtual line" means the smaller angle of the angles between the tangent to the end portion of first incidence surface 322 on second incidence surface 324 side, and the first virtual line orthogonal to central axis CA.

Further, second incidence surface 324 is rotationally symmetrical (circularly symmetrical) about central axis CA. The shape of second incidence surface 324 in the cross section including central axis CA may be a straight line, or a curve. In the present embodiment, the shape of second incidence surface 324 in the cross section including central axis CA is a straight line. That is, the inclination angle of the tangent to second incidence surface 324 with respect to the first virtual line is constant from the outer edge of first incidence surface 322 to the opening edge of first recess 310. In this manner, second incidence surface 324 is formed such that the distance thereof from central axis CA increases toward rear surface 305, and accordingly the light incident on second incidence surface 324 is refracted toward emission surface 330 side. With this configuration, in the present embodiment, the light incident on second incidence surface 324 does not directly reach second recess 340. This point is described in detail later.

Rear surface 305 is a plane surface that extends in the radial direction from the opening edge of first recess 310 on the rear side of the light flux controlling member 300.

Emission surface 330 is disposed so as to protrude from flange part 350 on the front side of light flux controlling member 300 (light diffusion plate 120 side). Emission surface 330 emits the light having entered light flux controlling member 300 to the outside while controlling the travelling direction of the light. Emission surface 330 intersects central axis CA, and is rotationally symmetrical (circularly symmetrical) about central axis CA.

Emission surface 330 includes first emission surface 330*a* located in a predetermined range around central axis CA, second emission surface 330*b* continuously formed at the periphery of first emission surface 330*a*, and third emission surface 330*c* that connects second emission surface 330*b* and flange part 350 (see FIG. 10C). First emission surface 330*a* is a curved surface protruding toward the rear side. Second emission surface 330*b* is a smooth curved surface located at the periphery of first emission surface 330*a* and protruding toward the front side. Second emission surface 330*b* has an annular protruding shape. Third emission surface 330*c* is a curved surface located at the periphery of second emission surface 330*b*. As illustrated in FIG. 10C, in the cross section including central axis CA, third emission surface 330*c* may have a linear shape, or a curved shape.

Second recess 340 is disposed so as to surround first recess 310 (incidence surface 320) with respect to optical axis OA on rear surface 305. Second recess 340 reflects, in the lateral direction (outward with respect to central axis CA in the radial direction), a part of light which is incident on incidence surface 320 and is internally reflected toward rear surface 305 by emission surface 330. In the cross section including central axis CA, second recess 340 has a substantially V-shape. Second recess 340 includes inner inclined surface 342 disposed on optical axis OA (central axis CA) side, and outer inclined surface 344 disposed on the outside relative to inner inclined surface 342.

Inner inclined surface 342 is disposed on central axis CA side. Inner inclined surface 342 is disposed along central axis CA. Inner inclined surface 342 is formed in a cylindrical shape around central axis CA.

Outer inclined surface 344 is disposed at a position remote from central axis CA relative to inner inclined surface 342. In the cross section including central axis CA, outer inclined surface 344 is tilted such that the distance thereof from central axis CA increases toward rear surface 305. The shape of outer inclined surface 344 in the cross section including central axis CA is not limited. The shape of outer inclined surface 344 in the cross section including central axis CA may be a straight line, or a curve. In the present embodiment, the shape of outer inclined surface 344 in the cross section including central axis CA is a straight line.

Inner inclined surface 342 and outer inclined surface 344 may be continuously disposed, or separated from each other. In the case where inner inclined surface 342 and outer inclined surface 344 are separated from each other, another surface is disposed between inner inclined surface 342 and outer inclined surface 344.

The position of second recess 340 is not limited, and preferably, second recess 340 is formed in a region where a large quantity of light reflected by emission surface 330 reaches. The arrival position of the light reflected by emission surface 330 differs depending on various factors such as the shape of emission surface 330, and therefore is appropriately set in accordance with light flux controlling member 300.

As described above, second recess 340 is disposed at a position remote from central axis CA relative to second incidence surface 324 (at a position outside second incidence surface 324). Accordingly, the relationship between second incidence surface 324 and second recess 340 is important in view of controlling the light such that the light incident on second incidence surface 324 does not directly reach second recess 340. In view of this, in light flux controlling member 300 according to the present embodiment, second incidence surface 324 is formed such that Expression (1), which represents a relationship between second incidence surface 324 and second recess 340, is satisfied.

[Expression 6]

$$h1 < h2 + d \times \cot(\theta1 + \theta2) \quad (1)$$

Figure 11A:
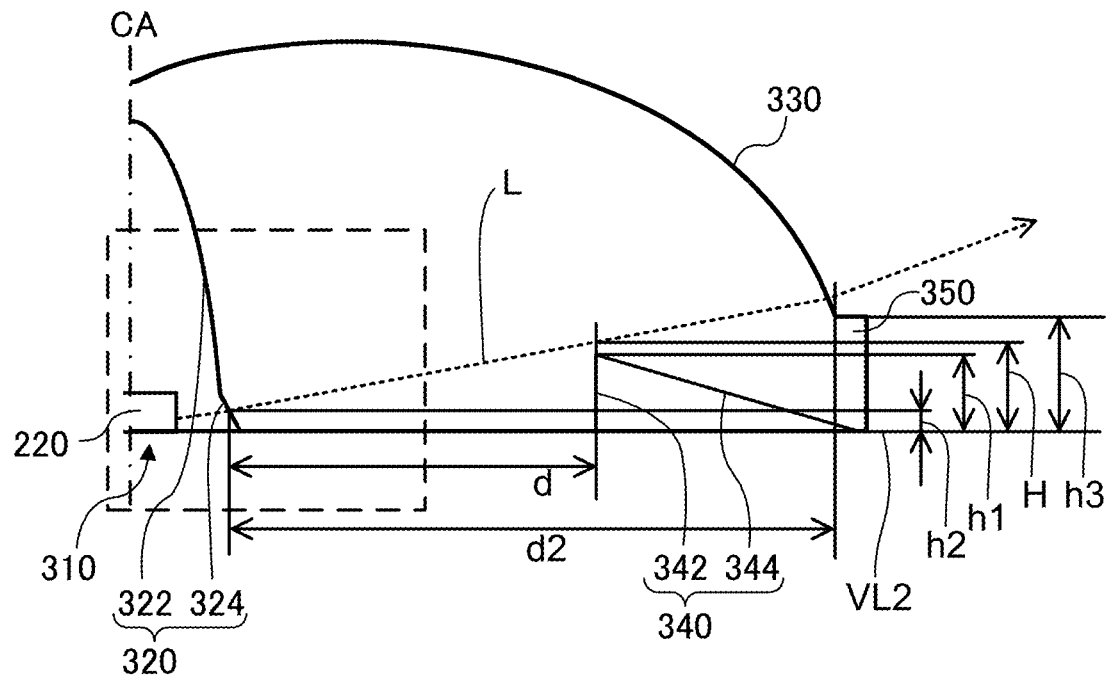
FIGS. 11A and 11B are partially enlarged sectional views of the light flux controlling member according to Embodiment 1 for describing Expression (1)
Figure 11B:
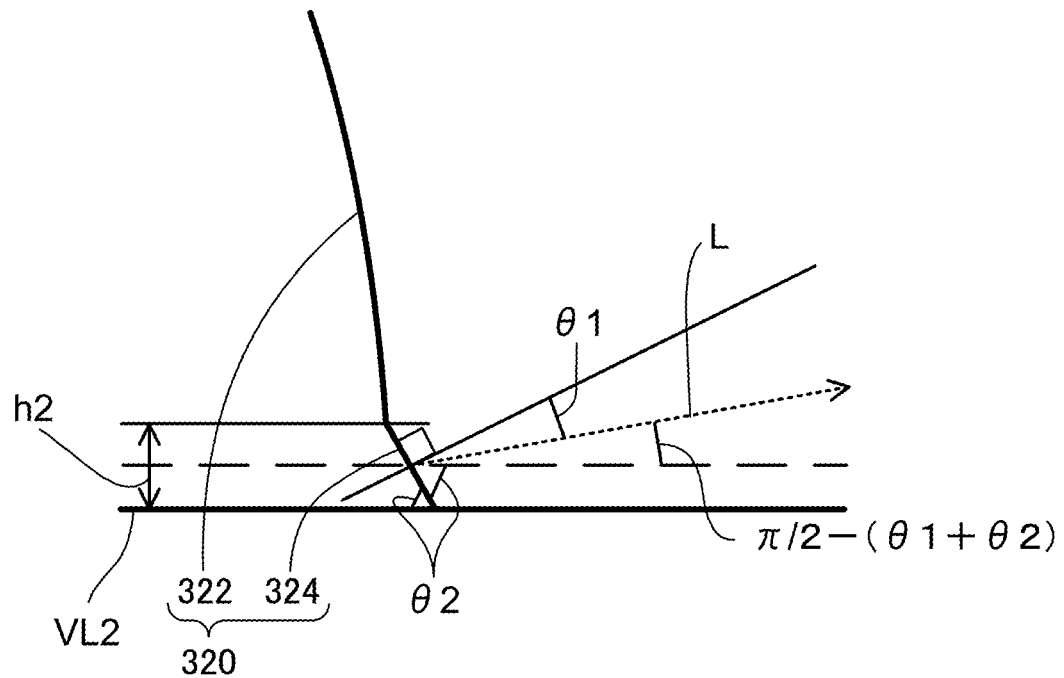

FIGS. 11A and 11B are partially enlarged sectional views of the light flux controlling member for describing Expression (1). As illustrated in FIGS. 11A and 11B, h1 is a distance between second virtual line VL2 that is orthogonal to central axis CA and passes through the opening edge of first recess 310 and the apex of second recess 340 in the cross section including central axis CA, and h2 is a distance between second virtual line VL2 and an incident position of light which is emitted from light-emitting element 220 and is incident on second incidence surface 324 in the cross section including central axis CA. In addition, d is a distance between the incident position of light incident on second incidence surface 324 and the apex of second recess 340 in the direction orthogonal to central axis CA in the cross section including central axis CA. Further, $\theta1$ is a refraction angle of light on second incidence surface 324 at the incident position in the cross section including central axis CA, and $\theta2$ is an inclination angle of the tangent to the incident position of light incident on second incidence surface 324 with respect to second virtual line VL2 in the cross section including central axis CA. Here, the "inclination angle of the tangent to the incident position of light incident on second incidence surface 324 with respect to second virtual line VL2" is the smaller angle of the angles between the tangent to the incident position of light incident on second incidence surface 324 and the second virtual line.

H is a distance between light L and second virtual line VL2 at the position of the apex of second recess 340 in plan view of light flux controlling member 300. H can be expressed by Expression (1A).

[Expression 7]

$$H = h2 + d \times \tan\{\pi/2 - (\theta1 + \theta2)\} \quad (1A)$$

Here, to control the light such that light L which is emitted from light-emitting element 220 and is incident on second incidence surface 324 does not directly reach second recess 340 (inner inclined surface 342), it is required that light L travel on the front side relative to the apex of second recess 340 in the direction along central axis CA. To be more specific, it is required that H be greater than h1. That is, it is required that second incidence surface 324 and second recess 340 satisfy Expression (1).

[Expression 8]

$$h1 < h2 + d \times \cot(\theta1 + \theta2) \quad (1)$$

In the case where second incidence surface 324 and second recess 340 are designed to satisfy Expression (1), light L which is emitted from light-emitting element 220 and is incident on second incidence surface 324 travels on the front side relative to the apex of second recess 340 without directly reaching second recess 340 (inner inclined surface 342).

In addition, the process of obtaining Expression (1) is applicable also to the designing of light flux controlling member 300 such that light L which is emitted from light-emitting element 220 and is incident on second incidence surface 324 does not directly reach flange part 350. To be more specific, d2 is set as the distance between the inner end of flange part 350 and an incident position of light L which is emitted from light-emitting element 220 and is incident on second incidence surface 324 in a direction orthogonal to central axis CA. In addition, h3 is set as a height of flange part 350 in the direction along central axis CA. $\theta1$ and $\theta2$ are the same as described above. In this case, h3 can be expressed by Expression (1B).

[Expression 9]

$$h3 < h2 + d \times \tan\{\pi/2 - (\theta1 + \theta2)\} \quad (1B)$$

Here, to control the light such that light L which is emitted from light-emitting element 220 and is incident on second incidence surface 324 does not directly reach flange part 350, it is required that light L travel on the front side relative to flange part 350 in the direction along central axis CA. To be more specific, it is required that H be greater than h3. That is, it is required that flange part 350 and second incidence surface satisfy Expression (1C).

[Expression 10]

$$h3 = h2 + d \times \cot(\theta1 + \theta2) \quad (1C)$$

In the case where second incidence surface 324 and flange part 350 are designed to satisfy Expression (1C), light L which is emitted from light-emitting element 220 and is incident on second incidence surface 324 travels on the front side relative to flange part 350 without directly reaching flange part 350.

In addition, by designing light flux controlling member 300 so as to satisfy Expression (1) and Expression (1C), the use efficiency of light can be further increased. While H is defined by light L in Expression (1A), it is possible to specify a minimum value of inclination angle θ2 of the outer edge of the second incidence surface in the case where a second recess of depth h1 is formed, by specifying light L as light that is parallel to second virtual line VL2, and by defining that H which is obtained in the case where the light L is refracted at the opening edge of first recess 310 (the outermost edge of second incidence surface 324) and enters light flux controlling member 300 (that is h2=0) is greater than h1 (H>h1).

Figure 12:
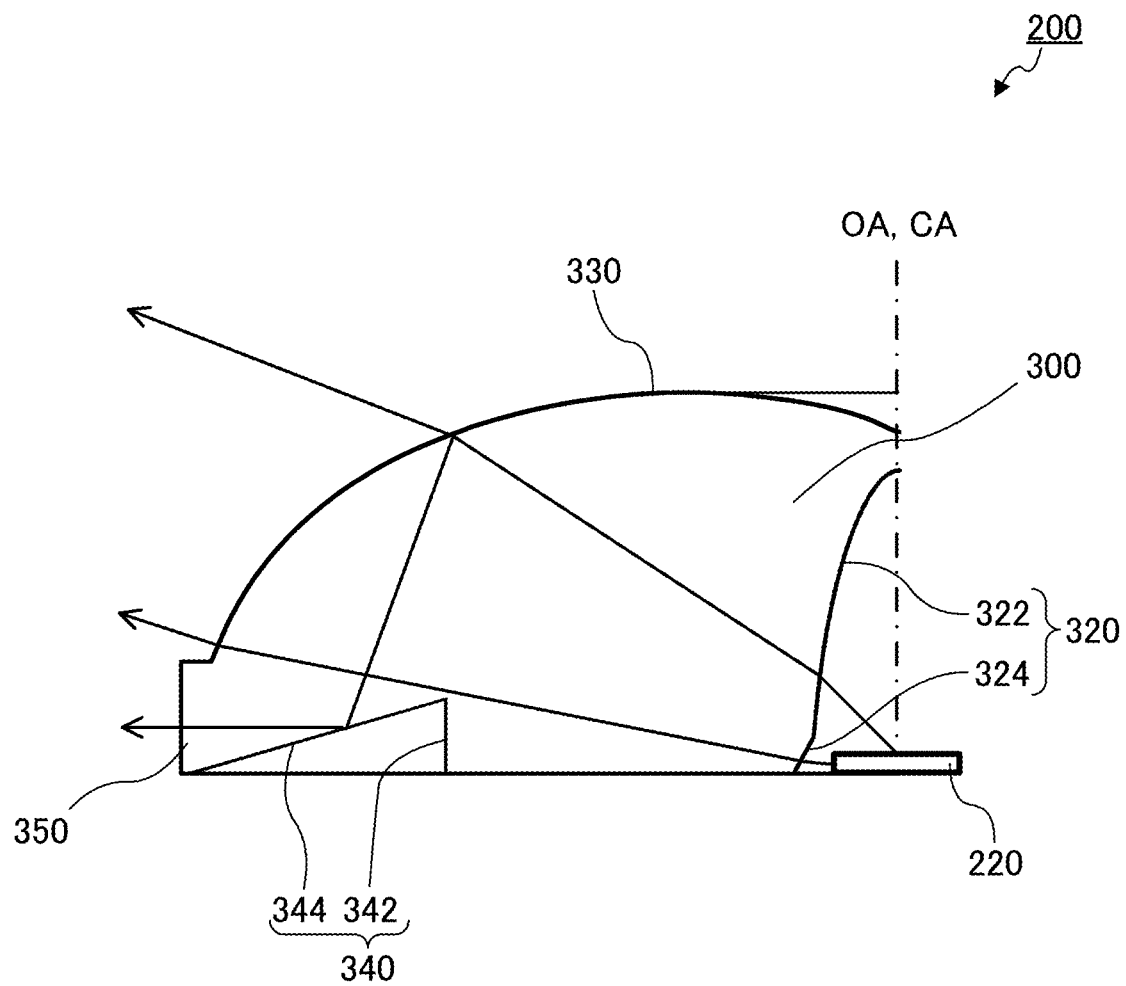
FIG. 12 illustrates light paths of a light-emitting device according to Embodiment 1.

FIG. 12 illustrates light paths of light-emitting device 200. It is to be noted that, in FIG. 12, hatching of light-emitting element 220 and light flux controlling member 300 is omitted to illustrate light paths.

As illustrated in FIG. 12, in the light emitted from light-emitting element 220, the light emitted from the light-emitting surface of the upper part enters light flux controlling member 300 from first incidence surface 322. A large part of the light incident on first incidence surface 322 is emitted out of light flux controlling member 300 from emission surface 330 while being refracted by emission surface 330 in such a manner that the travelling direction of the light is controlled. A part of the light incident on first incidence surface 322 is internally reflected by emission surface 330 and reaches second recess 340 (outer inclined surface 344). A large part of the light reaching second recess 340 is laterally reflected by outer inclined surface 344. The light reflected by outer inclined surface 344 is emitted from flange part 350, for example.

On the other hand, in the light emitted from light-emitting element 220, the light emitted from the light-emitting surface of the side part enters light flux controlling member 300 from second incidence surface 324. At this time, the light emitted from light-emitting element 220 is refracted by second incidence surface 324 toward emission surface 330 side. The light incident on second incidence surface 324 is emitted out of light flux controlling member 300 from emission surface 330 while being refracted by emission surface 330 in such a manner that the travelling direction of the light is controlled.

(Light Distribution Characteristics of Surface Light Source Device)

Figure 13:
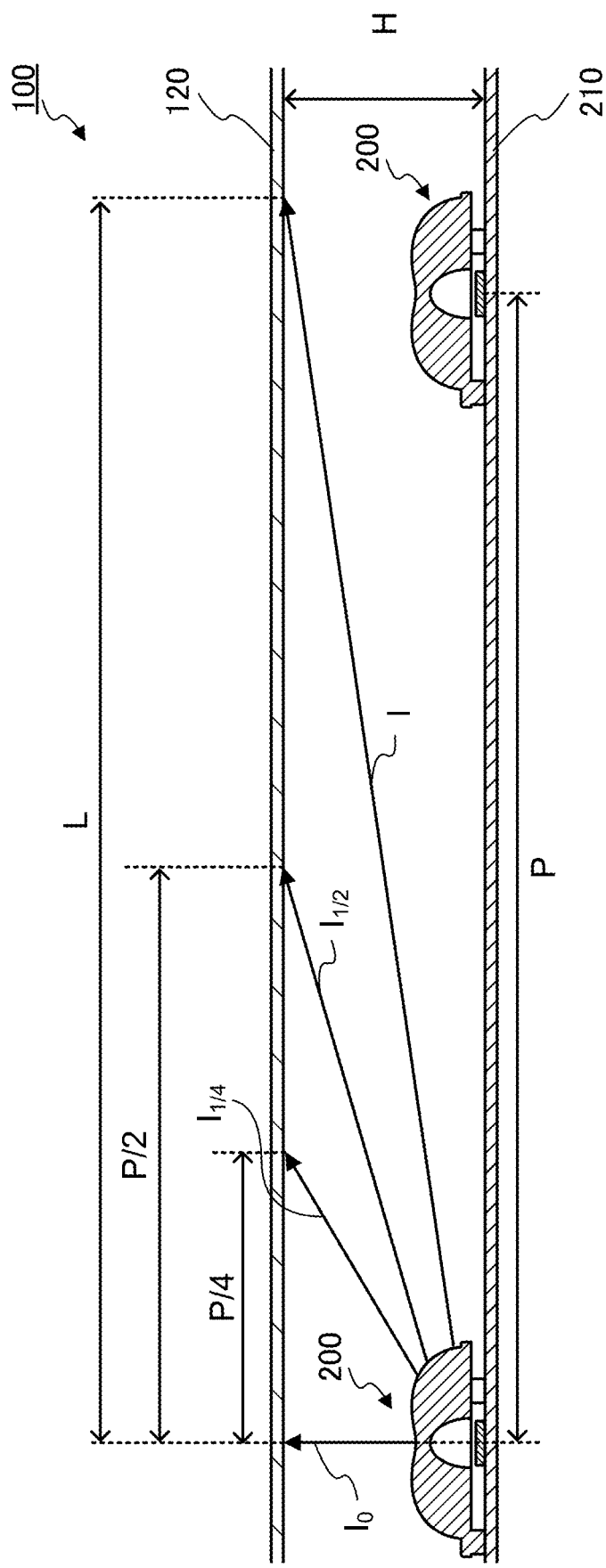
FIG. 13 is a partially enlarged sectional view of the surface light source device according to Embodiment 1 for describing Expression (2), Expression (3), Expression (4) and Expression (5)

FIG. 13 is a partially enlarged sectional view of surface light source device 100 according to the present embodiment. In FIG. 13, casing 110 is omitted. In recent years, there is a demand for further thinning surface light source device 100 and energy saving by further reducing the number of light-emitting elements 220 of surface light source device 100. In view of this, Expression (2) can be a condition for achieving energy saving, thinning, and reducing the luminance unevenness in surface light source device 100 including the above-described light flux controlling member 300.

[Expression 11]

$$\frac{H}{P} \leq 0.2 \quad (2)$$

In Expression (2), P represents a center-to-center distance (pitch) of a plurality of light-emitting devices 200, and H represents a distance (height) between the top surface of substrate 120 and the bottom surface of light diffusion plate 120.

In addition, it is preferable that surface light source device 100 satisfy Expression (3) while satisfying Expression (2), in order to prevent the luminance unevenness of the light-emitting surface. That is, the shapes of incidence surface 320 and emission surface 330 of light flux controlling member 300 are adjusted so as to satisfy Expression (3) in addition to Expression (1). As illustrated in FIG. 13, Expression (3) means that light (1) emitted from light-emitting device 200 at a peak emission angle reaches a position farther than another light-emitting device 200 adjacent thereto. With this configuration, it is possible to suppress generation of a bright spot (a region having a relatively high luminance) in the regions between light-emitting devices 200 of the light-emitting surface. To satisfy Expression (3), regarding the emission angle of light emitted from light-emitting device 200 (0 degree in light axis direction, and 90 degrees in the substrate surface direction), the emission angle (peak emission angle) of the light having a greatest luminous intensity is greater than 78.7 degrees.

[Expression 12]

$$\frac{L}{P} > 1 \quad (3)$$

In Expression (3), P represents a center-to-center distance (pitch) of a plurality of light-emitting devices 200, and L represents a distance between the arriving point on the bottom surface of light diffusion plate 120 of light emitted at a peak emission angle from light-emitting device 200, and the intersection of optical axis OA of light-emitting device 200 and the bottom surface of light diffusion plate 120.

In addition, it is preferable that surface light source device 100 also satisfy Expression (4) while satisfying Expression (3), in order to prevent the luminance unevenness of the light-emitting surface. That is, the shapes of incidence surface 320 and emission surface 330 of light flux controlling member 300 are adjusted to also satisfy Expression (4). As illustrated in FIG. 13, Expression (4) means that the luminous intensity of light ($I_{1/2}$) travelling to the middle point between two light-emitting devices 200 on the bottom surface of light diffusion plate 120 is higher than six times the luminous intensity of light ($I_0$) travelling to a position immediately above light-emitting device 200. With this configuration, it is possible to suppress generation of a dark point (a region having a relatively low luminance) in regions between light-emitting devices 200 of the light-emitting surface.

[Expression 13]

$$\frac{I_{1/2}}{I_0} > 6 \quad (4)$$

In Expression (4), $I_0$ represents a luminous intensity of light emitted from light-emitting device 200 in optical axis OA direction, and $I_{1/2}$ represents a luminous intensity, on the bottom surface of light diffusion plate 120, of light emitted from light-emitting device 200 toward a point distanced by P/2 from the intersection of optical axis OA and the bottom surface of light diffusion plate 120.

In addition, it is preferable that surface light source device 100 also satisfy Expression (5). That is, the shapes of incidence surface 320 and emission surface 330 of light flux controlling member 300 are adjusted to also satisfy Expression (5). As illustrated in FIG. 13, Expression (5) means that luminous intensity ($I_{1/4}$) of light travelling toward a middle point (P/4 point) between the middle point between two light-emitting devices 200 on the bottom surface of light diffusion plate 120 and one of light-emitting devices 200 is equal to or less than 2.4 times the luminous intensity ($I_0$) of light travelling toward the position immediately above light-emitting device 200. With this configuration, it is possible to suppress generation of a bright spot (a region having a relatively high luminance) near light-emitting device 200 of the light-emitting surface, and to further equalize the luminance distribution on the light-emitting surface.

[Expression 14]

$$\frac{I_{1/4}}{I_0} \leq 2.4 \quad (5)$$

In Expression (5), $I_0$ represents a luminous intensity of light emitted from light-emitting device 200 in optical axis OA direction ($I_0 \neq 0$), and $I_{1/4}$ represents a luminous intensity, on the bottom surface of light diffusion plate 120, of light emitted from light-emitting device 200 toward a point distanced by P/4 from the intersection of optical axis OA and the bottom surface of light diffusion plate 120.

(Light Distribution Characteristics of Light-emitting Device)

The light distribution characteristics were measured with light-emitting device 200 that is used in surface light source device 100 according to the present embodiment. In addition, for reference purposes, the light distribution characteristics were measured with light-emitting devices (hereinafter referred to as "light-emitting devices according to Reference examples 1 to 3") having light flux controlling members differing in the shapes of the emission surface. The characteristics of light-emitting device 200 according to the present embodiment and three types of light-emitting devices according to Reference examples 1 to 3 are shown in Table 1.

TABLE 1

|  | Ex | Ref. 1 | Ref. 2 | Ref. 3 |
|---|---|---|---|---|
| Name | P110 | P60 | P75 | P90 |
| Optimum pitch | 110 mm | 60 mm | 75 mm | 90 mm |
| Peak emission angle | 81° | 72° | 75° | 77° |
| Luminous intensity of Peak emission angle | 59 cd | 38 cd | 43 cd | 53 cd |
| Luminous intensity at 0° ($I_0$) | 2.5 cd | 3.3 cd | 2.8 cd | 2.9 cd |

Figure 14A:
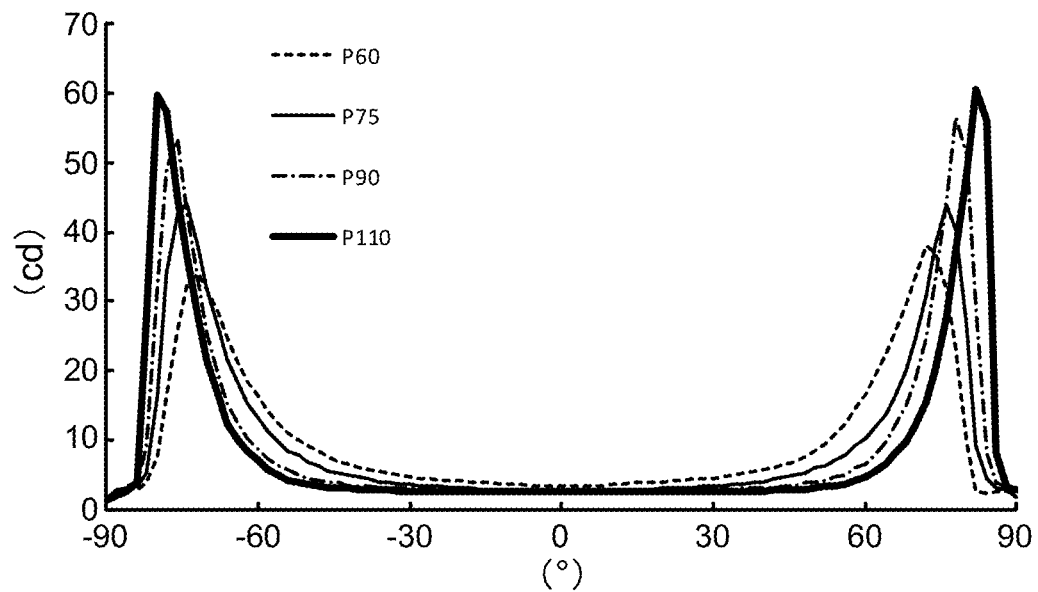
FIGS. 14A and 14B are graphs illustrating light distribution characteristics of light-emitting devices of four types.
Figure 14B:
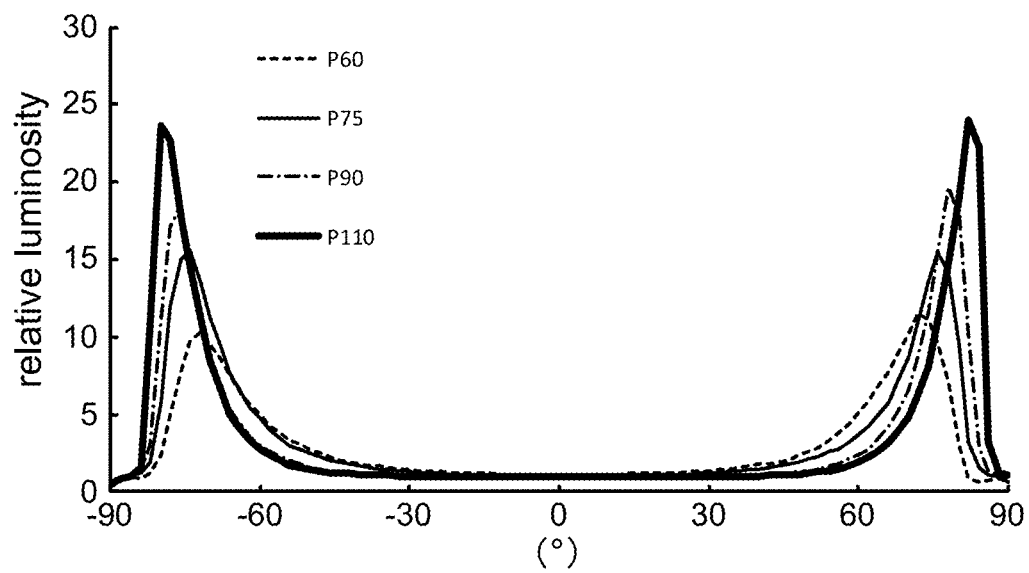

FIGS. 14A and 14B are graphs illustrating the light distribution characteristics of the light-emitting devices of four types shown in Table 1 (P110), P60, P75 and P90). The abscissa indicates angles (°) in the case where the center of the light emitting surface of the light emitting element is defined as the origin and the optical axis OA of the light-emitting device is set at 0 degree. The ordinate of FIG. 14A indicates a luminous intensity (cd) at each angle, and the ordinate of FIG. 14B indicates a relative luminous intensity. FIG. 14B illustrates a relative luminous intensity of each light-emitting device in which the luminous intensity at 0 degree is set as 1. A result of light-emitting device 200 (P110) according to the present embodiment is indicated with the thick solid line. Measurement results of the light-emitting devices according to Reference examples 1 to 3 (P60, P75 and P90) are indicated with the thin broken line, the thin solid line or the thin dashed line.

It can be said from FIGS. 14A and 14B that, in light-emitting device 200 (P110) according to the present embodiment, the peak emission angle is 78.7 degrees or greater, and that light-emitting device 200 can generate light travelling toward a remote position more than the light-emitting devices according to Reference examples 1 to 3 (P60, P75 and P90).

(Luminance Distribution of Light-emitting Device and Luminance Distribution of Surface Light Source Device)

Figure 1A:
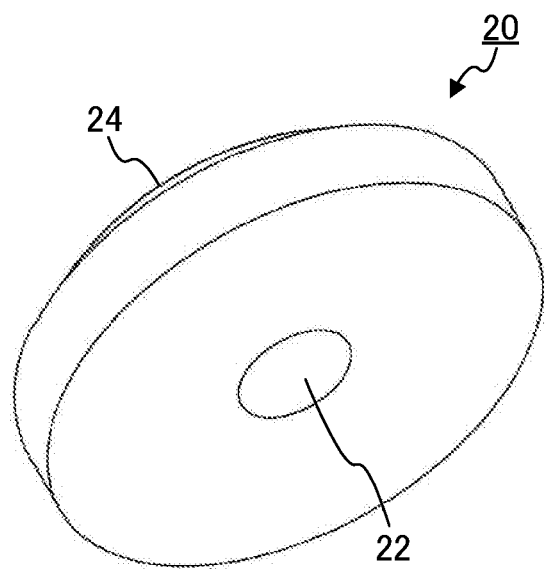
FIGS. 1A to 1C illustrate a configuration of a conventional light flux controlling member.
Figure 1B:
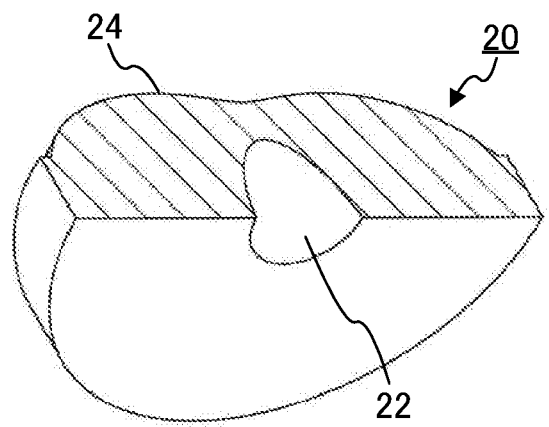
Figure 1C:
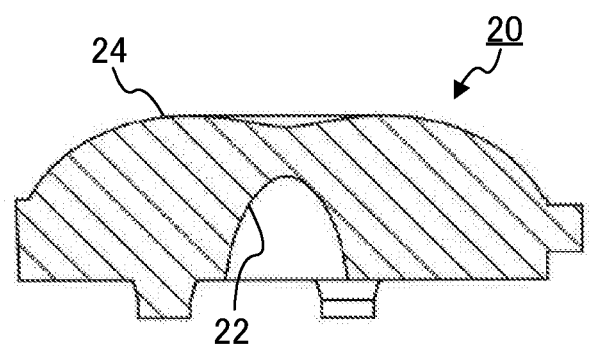
Figure 2A:
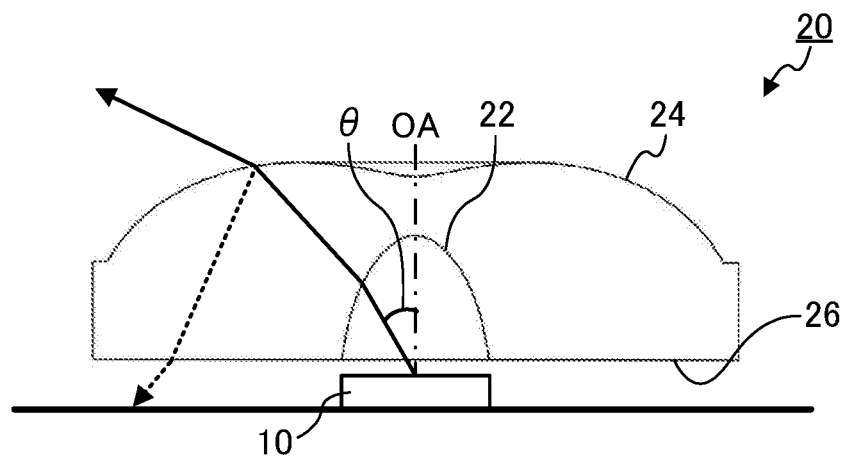
FIGS. 2A and 2B illustrate light paths of a conventional light flux controlling member.
Figure 2B:
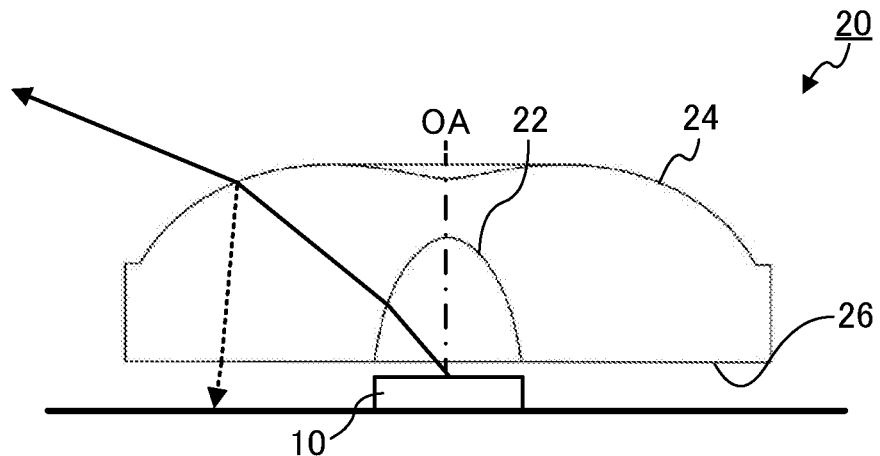
Figure 3A:
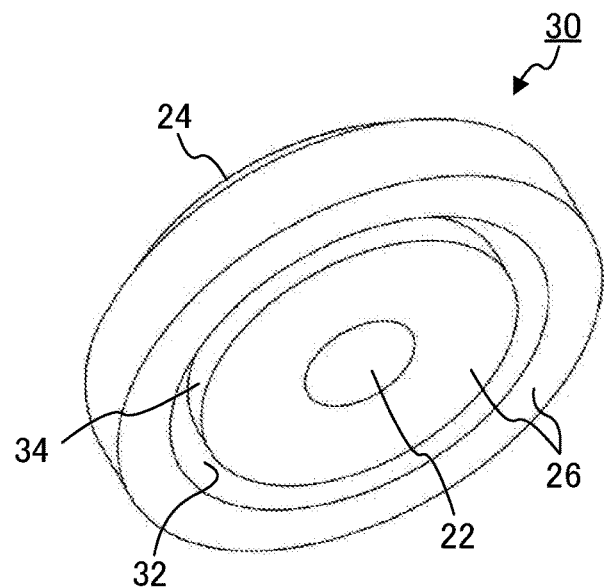
FIGS. 3A to 3C illustrate a configuration of the light flux controlling member disclosed in PTL 1.
Figure 3B:
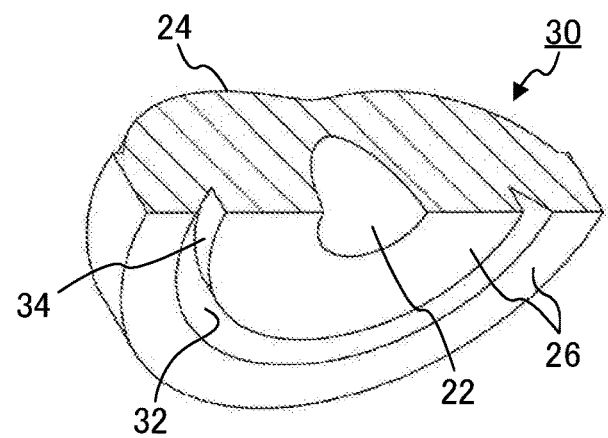
Figure 3C:
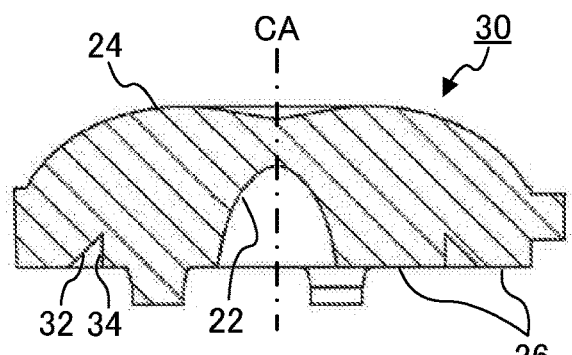
Figure 4A:
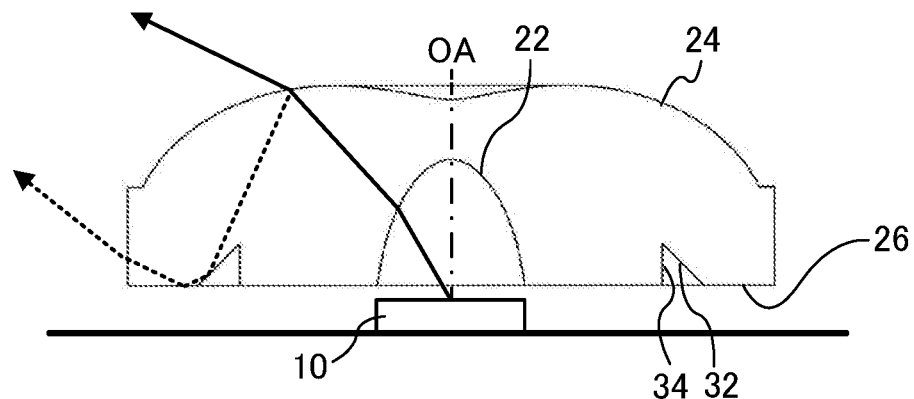
FIGS. 4A and 4B illustrate light paths of the light flux controlling member disclosed in PTL 1.
Figure 4B:
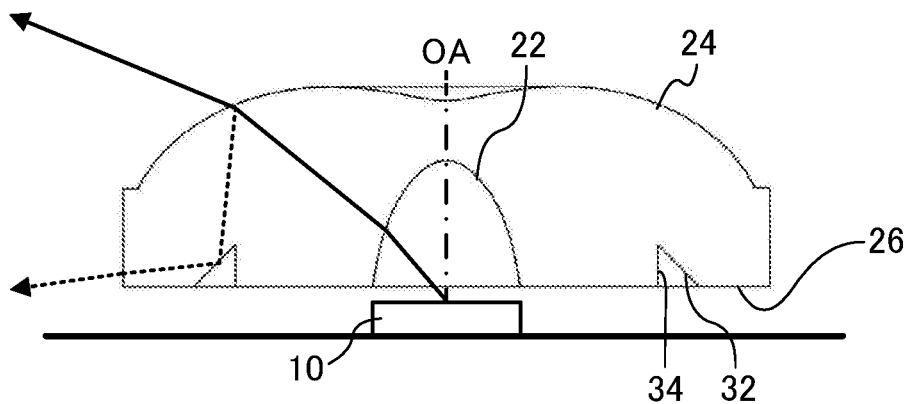
Figure 5:
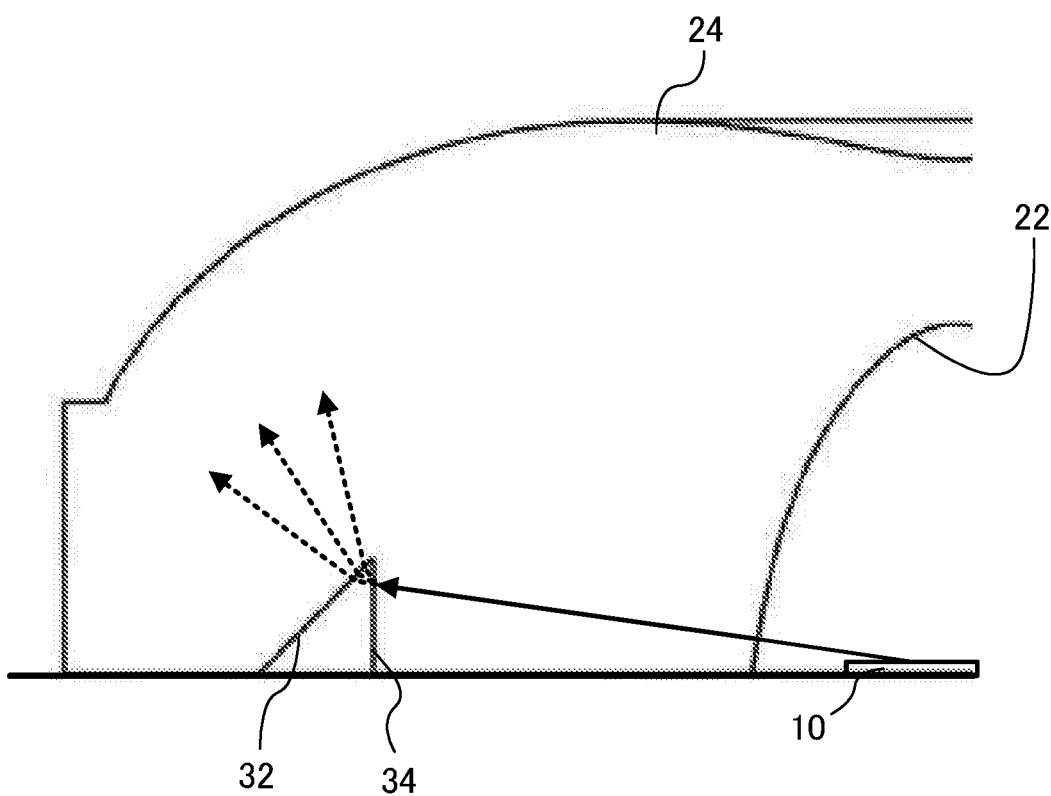
FIG. 5 illustrates other light paths of the light flux controlling member disclosed in PTL 1.

Next, the luminance distribution was measured with light-emitting device 200 according to the present embodiment. In this measurement, light-emitting element 220 and light-emitting device 200 that satisfies Expression (1) were used. In addition, a luminance distribution on a virtual plane disposed over light-emitting device 200 fixed to substrate 210 with an air layer therebetween was measured. In addition, for comparison, a luminance on a virtual plane of a light-emitting device using light flux controlling member 30 having no second incidence surface 324 illustrated in FIG. 3 (hereinafter referred to as "the light-emitting device according to Comparative example 1") was also measured. It is to be noted that, in light-emitting device 200 according to the present embodiment and the light-emitting device according to Comparative example 1, optical axis OA of the light-emitting element and central axis CA of light flux controlling member 300 coincide with each other.

Figure 15:
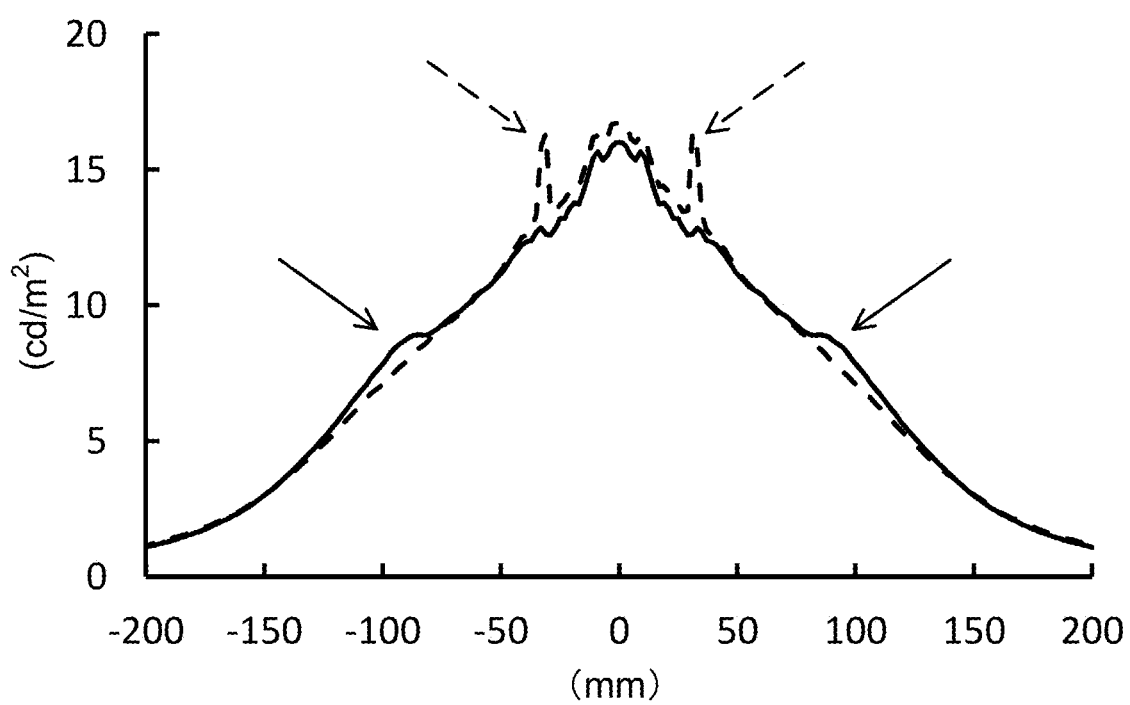
FIG. 15 is a graph illustrating a luminance distribution in the light-emitting device.

FIG. 15 is a graph showing a simulation result of a luminance distribution on a virtual plane disposed over light-emitting device 200 with an air layer therebetween in the cross section including optical axis OA. In FIG. 15, the abscissa indicates a distance (mm) from optical axis OA on the virtual plane, and the ordinate indicates luminance (cd/m²). In FIG. 15, the solid line indicates a result of light-emitting device 200 (P110) according to the present embodiment, and the broken line indicates a result of the light-emitting device according to Comparative example 1.

As illustrated in FIG. 15, in the light-emitting device according to Comparative example 1, a ring-shaped bright spot is formed at a portion immediately above the light-emitting device (see the broken arrow of FIG. 15). It is considered that this is caused by the light incident on second incidence surface 324 which reaches second recess 340 (inner inclined surface 342) and emitted from emission surface 330 (third emission surface 330c) since the light flux controlling member does not satisfy Expression (1). In light-emitting device 200 according to the present embodiment, on the other hand, a ring-shaped bright spot at a portion immediately above light-emitting device 200 was suppressed, and the luminance in the region outside light-emitting device 200 was slightly increased (see the solid arrow of FIG. 15). It is considered that this is caused by the light incident on second incidence surface 324 which is emitted from emission surface 330 (third emission surface 330c) without reaching second recess 340 (inner inclined surface 342) since light flux controlling member 300 satisfies Expression (1).

Next, the luminance distribution was measured with surface light source device 100 including light-emitting device 200 (P110) having light flux controlling member 300 according to the present embodiment that satisfies Expression (1). In addition, for reference purposes, the luminance distribution was measured also with surface light source devices including the light-emitting devices of Reference examples 1 to 3 (P60, P75 and P90). The light-emitting devices (P110, P60, P75 and P90) were disposed at respective optimum pitches in a surface light source device having height H of 19 mm (see Table 1).

Figure 16:
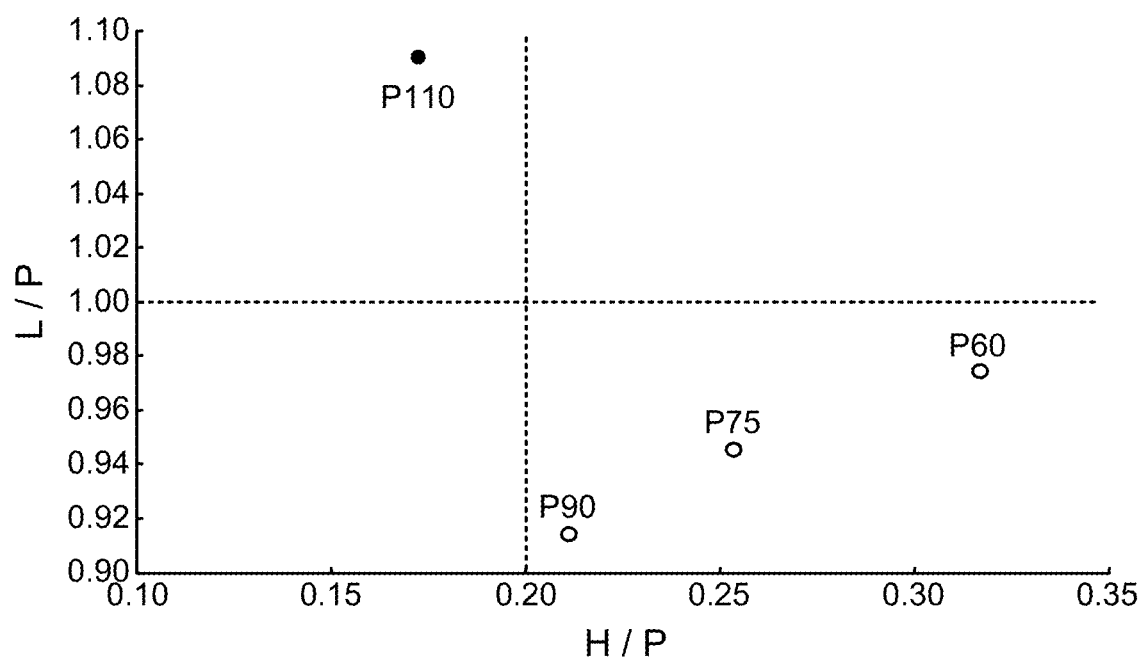
FIG. 16 is a graph illustrating values of H/P and L/P of surface light source devices of four types.

FIG. 16 is a graph illustrating values of H/P and L/P of the surface light source devices. As can be seen in this graph, in surface light source device 100 according to the present embodiment, H/P is 0.2 or smaller, and L/P is greater than 1. That is, surface light source device 100 according to the present embodiment satisfies Expression (2) and Expression (3). In the surface light source devices including the light-emitting devices of Reference examples 1 to 3 (P60, P75 and P90), on the other hand, H/P is greater than 0.2, and L/P is 1 or smaller. That is, these surface light source devices do not satisfy Expression (2) or Expression (3).

Figure 17A:
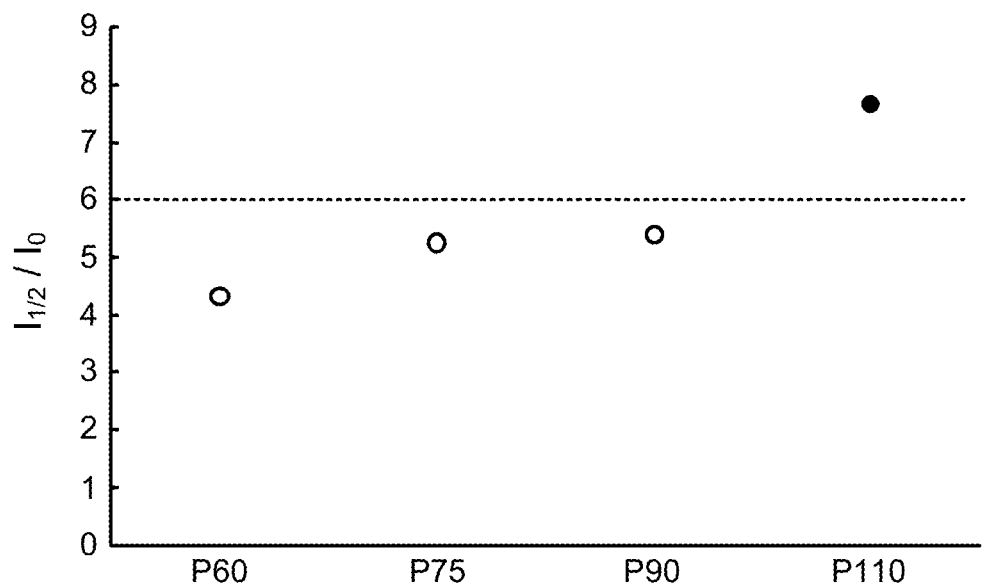
FIG. 17A is a graph illustrating values of $I_{1/2}/I_0$ of the light-emitting devices of four types.
Figure 17B:
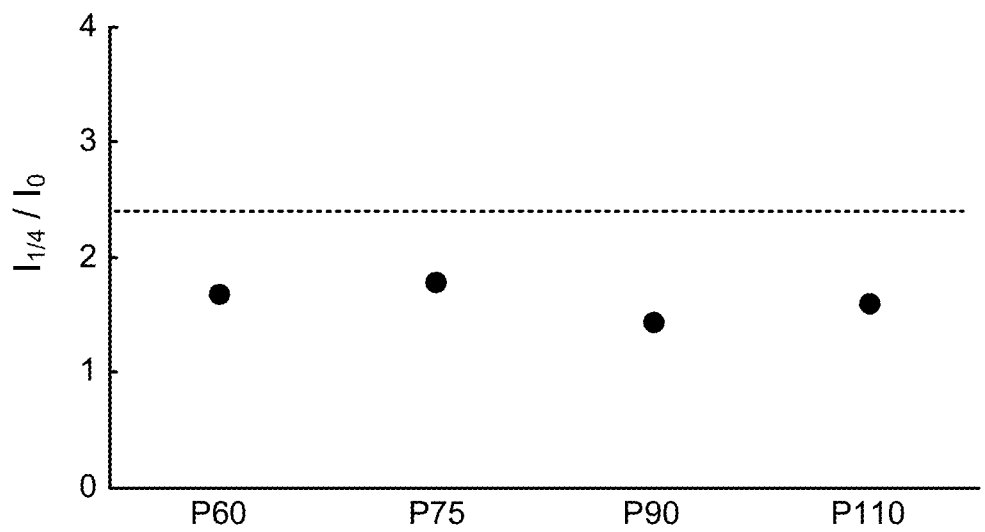
FIG. 17B is a graph illustrating values of $I_{1/4}/I_0$ of the light-emitting devices of four types.

FIG. 17A is a graph illustrating values of $I_{1/2}/I_0$ of the surface light source devices, and FIG. 17B is a graph illustrating values of $I_{1/4}/I_0$ of the surface light source devices. As illustrated in FIGS. 17A and 17B, in surface light source device 100 according to the present embodiment, $I_{1/2}/I_0$ is greater than 6, and $I_{1/4}/I_0$ is 2.4 or smaller. That is, surface light source device 100 according to the present embodiment satisfies Expression (4) and Expression (5). In the surface light source devices including the light-emitting devices of Reference examples 1 to 3 (P60, P75 and P90), on the other hand, $I_{1/4}/I_0$ is 2.4 or smaller, but $I_{1/2}/I_0$ is 6 or smaller. That is, these surface light source devices satisfy Expression (5), but do not satisfy Expression (4).

Figure 18A:
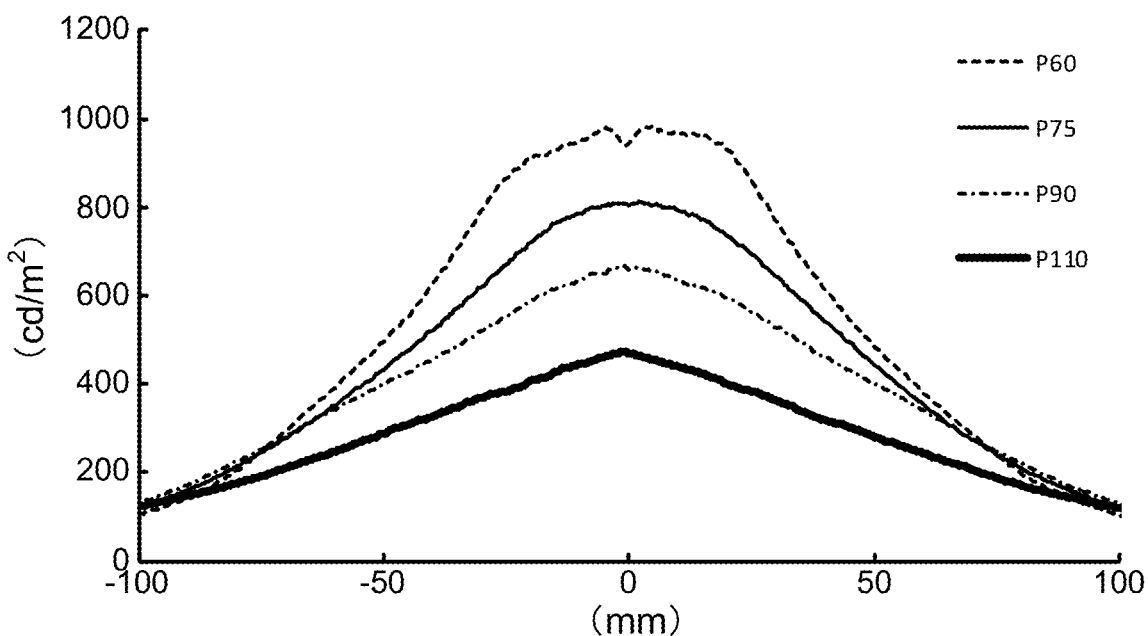
FIGS. 18A and 18B are graphs illustrating luminance distributions on the light-emitting surface in the case where only one light-emitting device is lighted in the surface light source devices of four types.
Figure 18B:
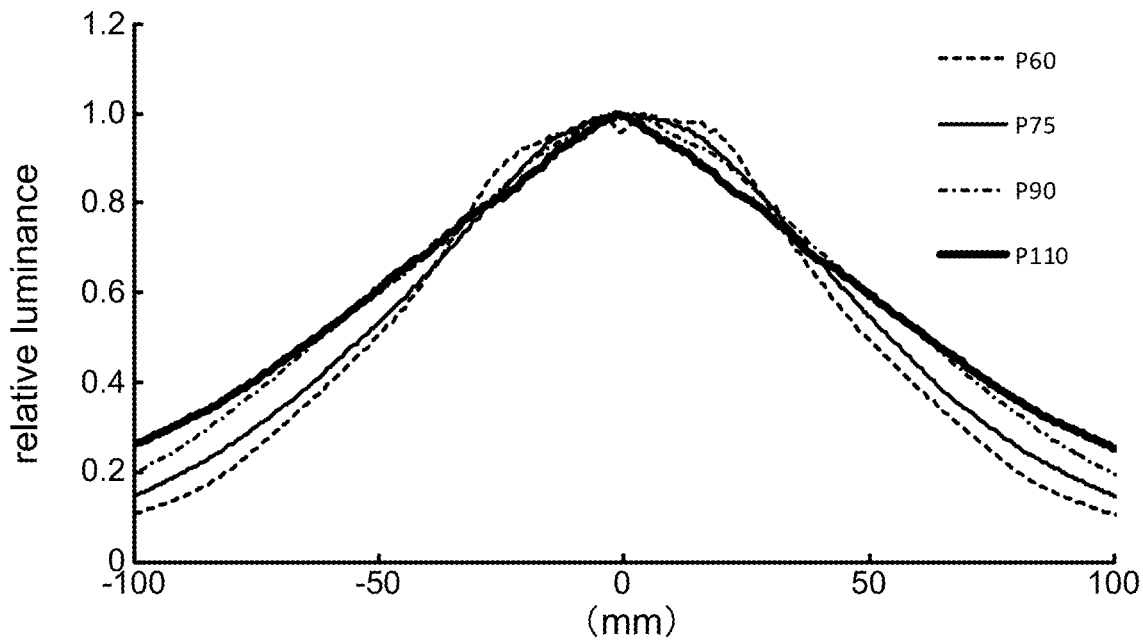

FIGS. 18A and 18B are graphs illustrating luminance distributions on the light-emitting surfaces in the case where only one light-emitting device is lighted in the surface light source devices. The abscissa indicates a distance from optical axis OA of the light-emitting device. The ordinate indicates a luminance at each point (FIG. 18A) or a relative luminance (FIG. 18B). FIG. 18B illustrates a relative luminance of each surface light source device in which the luminance on optical axis OA is set as 1. The result obtained with the surface light source device including light-emitting device 200 (P110) according to the present embodiment is indicated with the thick solid line. The measurement results obtained with the surface light source devices including the light-emitting devices of Reference examples 1 to 3 (P60, P75 and P90) are indicated with the thin broken line, the thin solid line or the thin dashed line.

As illustrated in FIG. 18B, it can be said that in the case where light-emitting devices 200 (P110) each including light flux controlling member 300 that satisfies Expression (1) are disposed at a pitch of 110 mm (H/P=0.17), sufficient brightness is obtained at an intermediate position (±55 mm) of light-emitting devices 200 on the light-emitting surface, whereas in the case where the light-emitting devices (P60 and P75) of Reference examples 1 and 2 are disposed at a pitch of 110 mm (H/P=0.17), the brightness is insufficient at the intermediate position (±55 mm). In addition, in the case where the light-emitting devices are disposed at a pitch of 110 mm (H/P=0.17) in a matrix, the center-to-center distance between the light-emitting devices in the diagonal direction is approximately 155 mm. In the case where light-emitting devices (P90) of Reference example 3 are disposed at a pitch of 110 mm (H/P=0.17), the brightness is insufficient at the intermediate position (±77.5 mm) in the diagonal direction on the light-emitting surface. In contrast, in light-emitting device 200 according to the present embodiment, sufficient luminance can be obtained even at the periphery portion of the luminance distribution on the light-emitting surface.

Figure 19A:
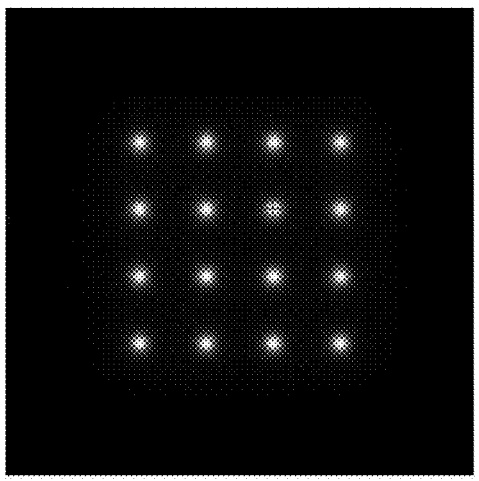
FIG. 19A illustrates a luminance distribution on the light-emitting surface of a surface light source device provided with no light flux controlling member.
Figure 19B:
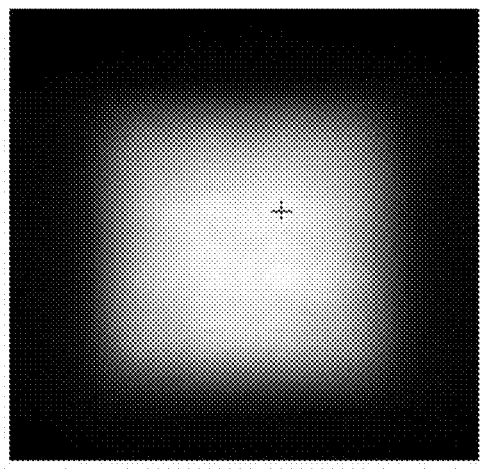
FIG. 19B illustrates a luminance distribution on the light-emitting surface of the surface light source device according to the embodiment of the present invention (H/P≤0.2, L/P>1, $I_{1/2}/I_0$>6, $I_{1/4}/I_0$≤2.4)
Figure 19C:
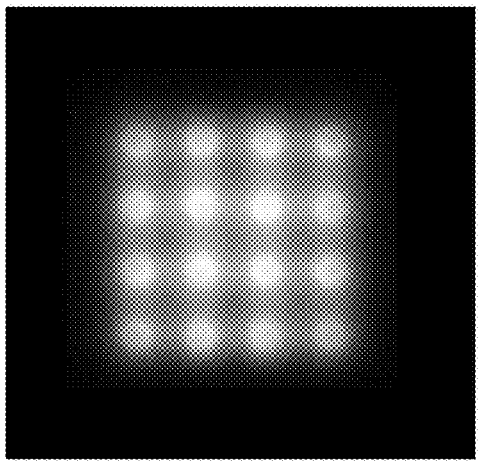
FIGS. 19C to 19E illustrate luminance distributions on the light-emitting surfaces of surface light source devices of Reference example (H/P≤0.2, L/P≤1, $I_{1/2}/I_0$≤6, $I_{1/4}/I_0$≤2.4)
Figure 19D:
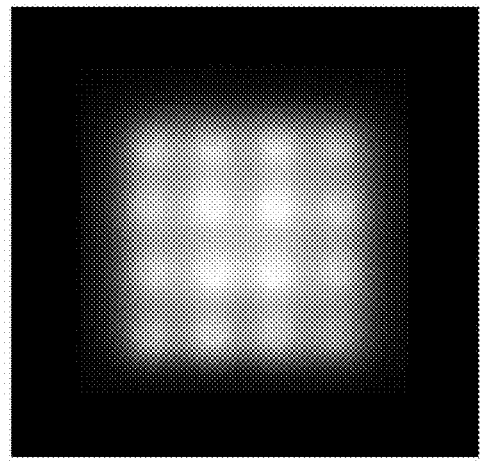
Figure 19E:
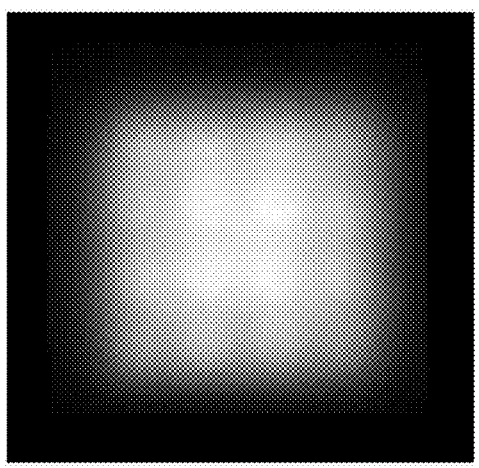

FIGS. 19A to 19E illustrate luminance distributions on the light-emitting surface in the case where sixteen light-emitting devices are lighted in each surface light source device. FIG. 19A illustrates a luminance distribution on the light-emitting surface in the case where no light flux controlling member is disposed, FIG. 19B illustrates a luminance distribution on the light-emitting surface of surface light source device 100 according to the present embodiment, FIG. 19C illustrates a luminance distribution on the light-emitting surface of the surface light source device including the light-emitting device (P60) of Reference example 1, FIG. 19D illustrates a luminance distribution on the light-emitting surface of the surface light source device including the light-emitting device (P75) of Reference example 2, and FIG. 19E illustrates a luminance distribution on the light-emitting surface of the surface light source device including light-emitting device (P90) of Reference example 3. The light-emitting devices are disposed in a surface light source device having height H of 19 mm at a pitch of 110 mm, and each surface light source device has an H/P of 0.17.

As illustrated in FIGS. 19C to 19E, luminance unevenness was significant in the surface light source devices including the light flux controlling members of Reference examples 1 to 3 (H/P≤0.2, L/P≤1, $I_{1/2}/I_0$≤6, $I_{1/4}/I_0$≤2.4). In contrast, luminance unevenness was slight in surface light source device 100 according to the present embodiment (H/P≤0.2, L/P>1, $I_{1/2}/I_0$>6, $I_{1/4}/I_0$≤2.4) while H/P is 0.2 or smaller as illustrated in FIG. 17B. Here the "slight" luminance unevenness means that the ratio of a minimum luminance with respect to a maximum luminance in a region between the light-emitting devices on the light-emitting surface is 95% or greater.

Accordingly, surface light source device 100 according to the present embodiment can emit uniform light from the light-emitting surface.

Figure 20:
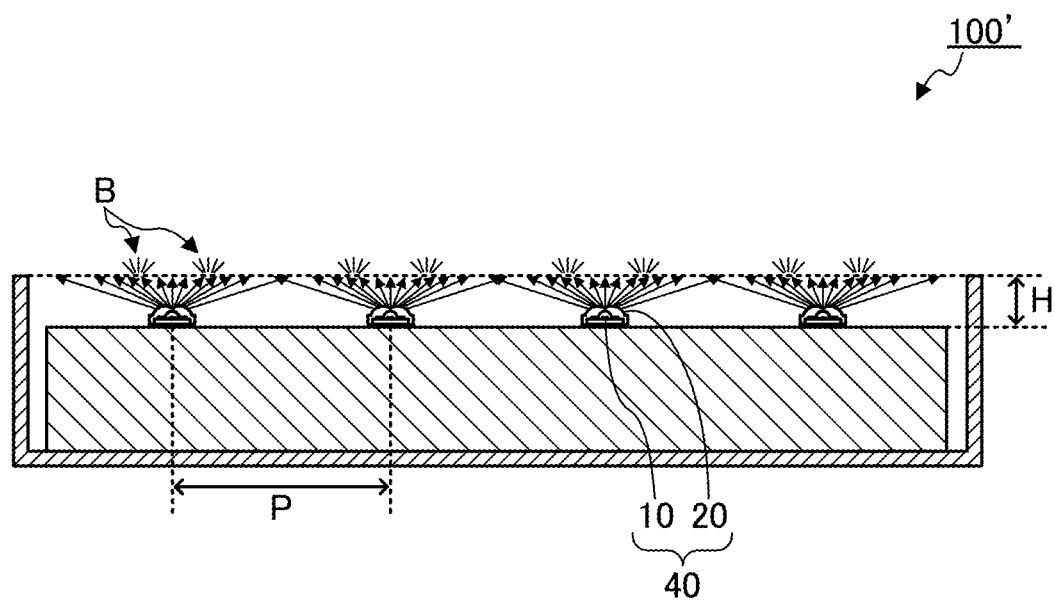
FIG. 20 is a sectional view illustrating light paths the surface light source device of Reference example (H/P≤0.2, L/P≤1, $I_{1/2}/I_0$>6, $I_{1/4}/I_0$≤2.4)

It is to be noted that, in the case where the surface light source device does not satisfy Expression (3), the light emitted from the light-emitting device at a peak emission angle (for example, 63 degrees) reaches a region between the light-emitting devices on the bottom surface of the light diffusion plate. Consequently, as illustrated in FIG. 20, in surface light source device 100' that does not satisfy only Expression (2) (H/P≤0.2, L/P≤1, $I_{1/2}/I_0$>6, $I_{1/4}/I_0$≤2.4), most of the light emitted from light-emitting device 40 reaches a region near light-emitting device 40 on the light-emitting surface (a region where light emitted at a peak emission angle reaches), thus forming a region where the quantity of light is insufficient between light-emitting devices 40 on the light-emitting surface. As a result, bright spot B having a relatively high brightness is formed near light-emitting device 40 on the light-emitting surface, thus causing luminance unevenness.

Figure 21A:
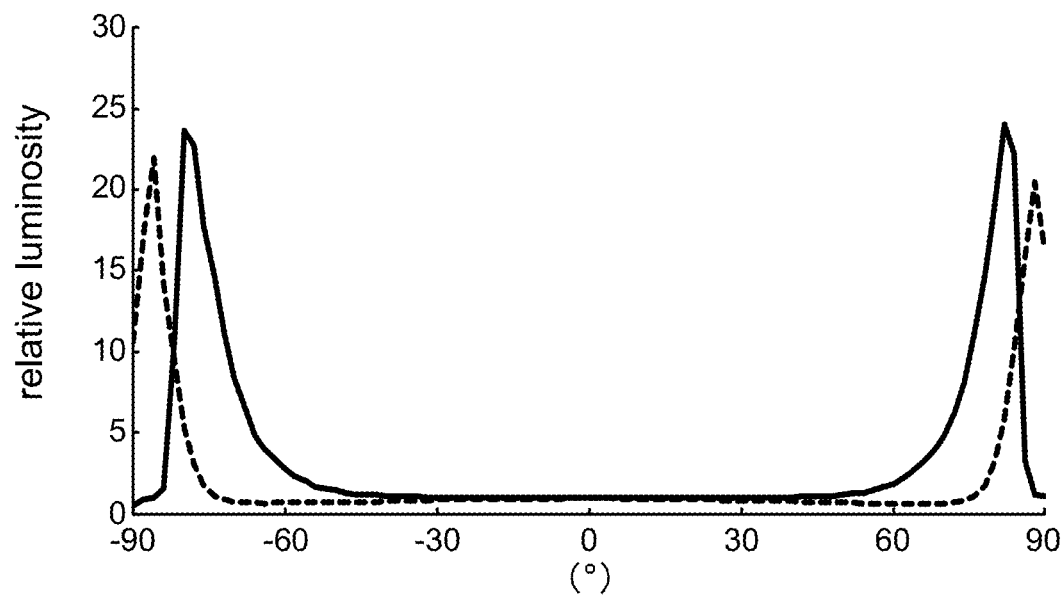
FIG. 21A is a graph illustrating light distribution characteristics of the light-emitting devices used in the surface light source devices of the present invention and Reference example ($I_{1/2}/I_0$≤6, $I_{1/4}/I_0$≤2.4)
Figure 21B:
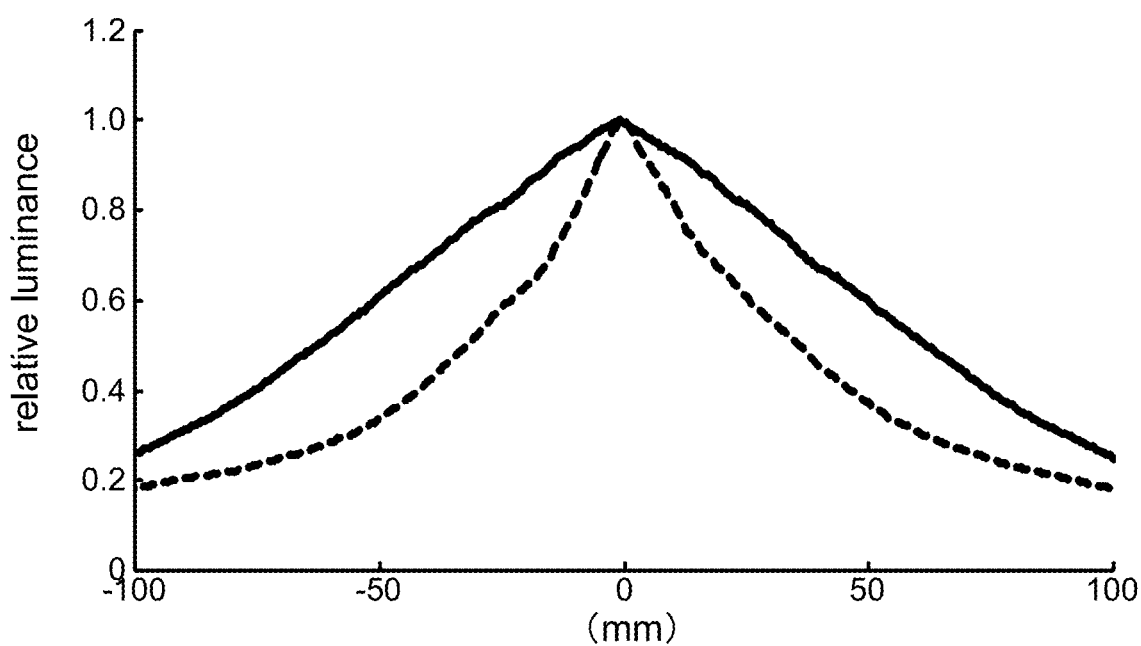
FIG. 21B is a graph illustrating luminance distributions on the light-emitting surfaces in the surface light source devices of the present invention and Reference example (H/P≤0.2, L/P>1, $I_{1/2}/I_0$≤6, $I_{1/4}/I_0$≤2.4) in the case where only one light-emitting device is lighted.
Figure 22:
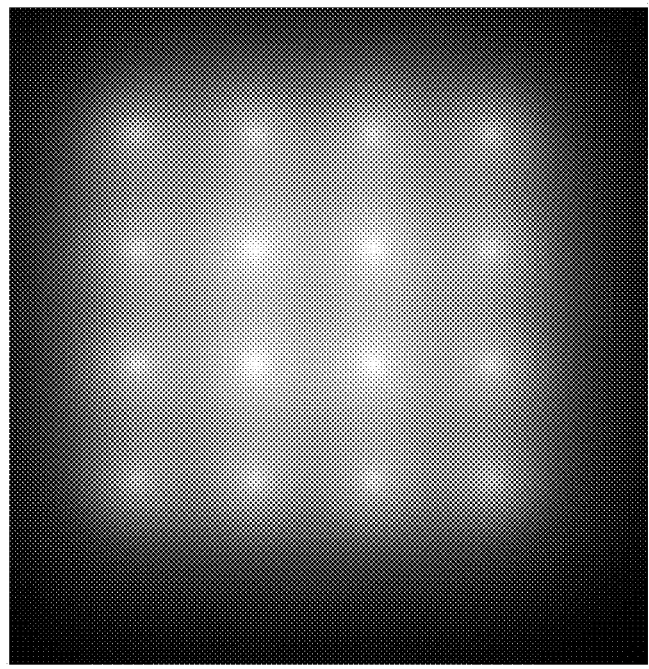
FIG. 22 illustrates a luminance distribution on the light-emitting surface of the surface light source device of Reference example (H/P≤0.2, L/P>1, $I_{1/2}/I_0$≤6, $I_{1/4}/I_0$≤2.4)

In addition, in the case where the surface light source device does not satisfy Expression (4), the light-emitting device has the light distribution characteristics indicated with the broken line in FIG. 21A. In FIG. 21A, the solid line is a curve representing light distribution characteristics of light-emitting device 200 (P110) according to the present embodiment. FIG. 21B is a graph illustrating luminance distributions on the light-emitting surfaces in the case where only one light-emitting device is lighted in a surface light source device including this light-emitting device. In FIG. 21B, the broken line is a curve representing a luminance distribution on the light-emitting surface of a surface light source device that does not satisfy only Expression (4) (H/P≤0.2, L/P>1, $I_{1/2}/I_0$≤6, $I_{1/4}/I_0$≤2.4), and the solid line is a curve representing a luminance distribution on the light-emitting surface of surface light source device 100 according to the present embodiment (H/P≤0.2, L/P>1, $I_{1/2}/I_0$>6, $I_{1/4}/I_0$≤2.4). In addition, FIG. 22 illustrates a luminance distribution on the light-emitting surface in the case where sixteen light-emitting devices are lighted in a surface light source device that does not satisfy only Expression (4) (H/P≤0.2, L/P>1, $I_{1/2}/I_0$≤6, $I_{1/4}/I_0$≤2.4). It can be said from these results that, in the case where the surface light source device does not satisfy Expression (4), the regions between light-emitting devices 40 on the light-emitting surface are relatively darkened, thus causing luminance unevenness.

Figure 23A:
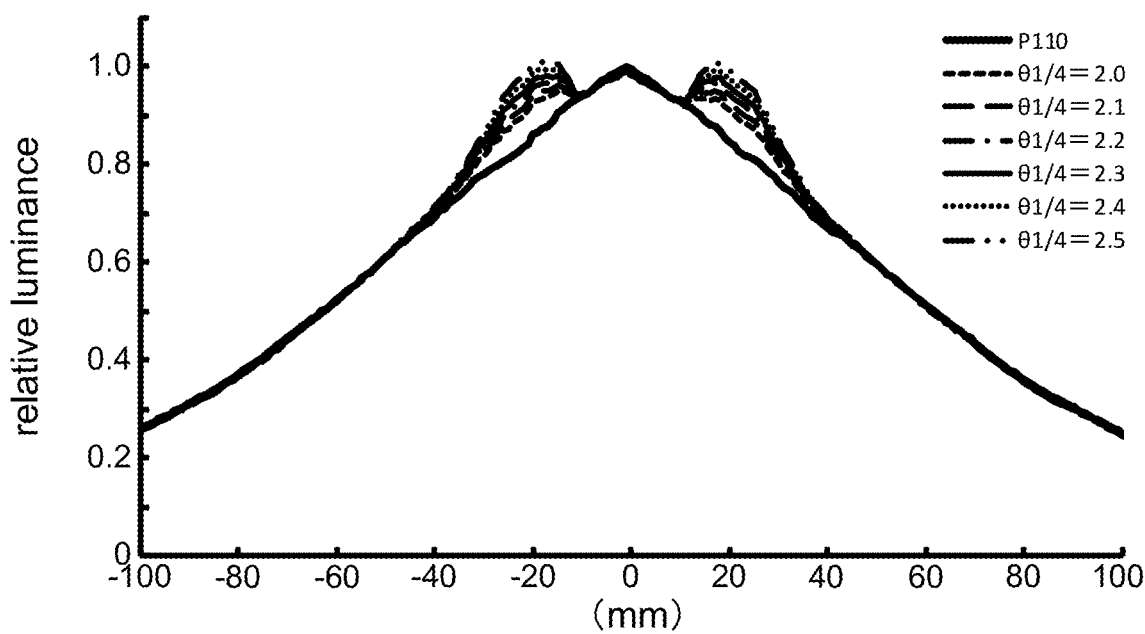
FIGS. 23A and 23B are graphs illustrating luminance distributions on the light-emitting surfaces in the case where only one light-emitting device is lighted in surface light source devices including respective light-emitting devices that are different from each other in $I_{1/4}/I_0$ value.
Figure 23B:
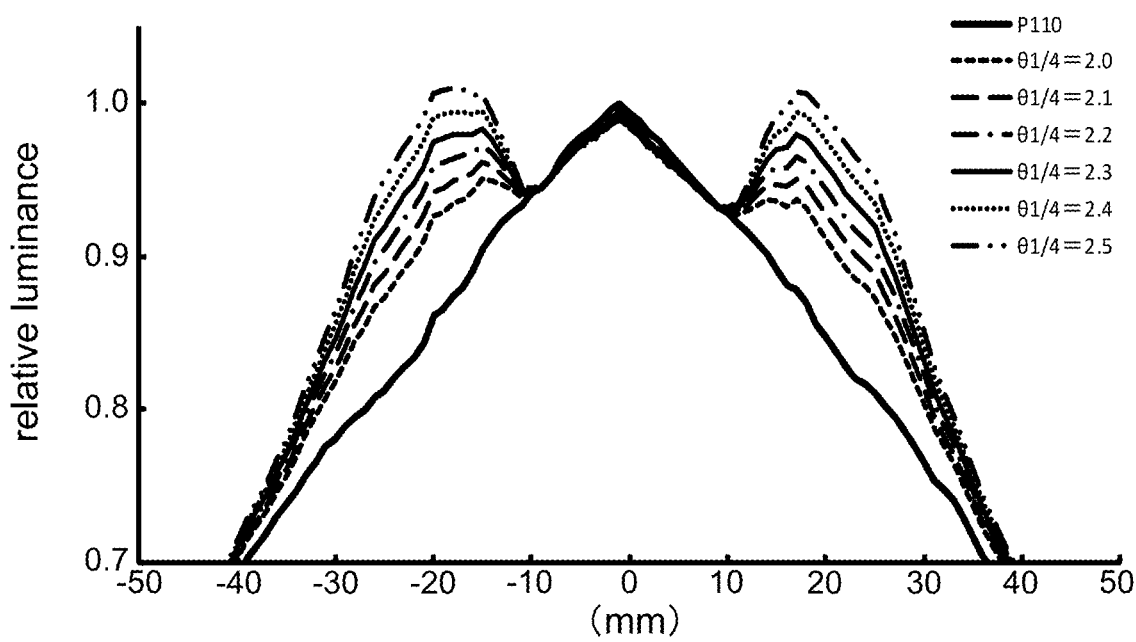

In addition, luminance unevenness is sufficiently suppressed in the case where the surface light source device satisfies Expression (2) to Expression (4) even in the case where Expression (5) is not satisfied; however, in the case where the surface light source device also satisfies Expression (5), the luminance distribution on the light-emitting surface is further equalized. FIGS. 23A and 23B are graphs illustrating luminance distributions on the light-emitting surfaces in the case where only one light-emitting device is lighted in surface light source devices including light-emitting devices that are different from each other in value of $I_{1/4}/I_0$. FIG. 23B illustrates the peak portion in the graph of FIG. 23A in an enlarged manner. The thick solid line is a curve representing a luminance distribution on the light-emitting surface of the surface light source device including light-emitting device 200 (P110) according to the present embodiment (H/P≤0.2, L/P>1, $I_{1/2}/I_0$>6, $I_{1/4}/I_0$=1.6). The thin broken line, thin solid line, thin dashed line and thin chain double-dashed line are curves respectively representing luminance distributions on the light-emitting surfaces of surface light source devices including other light-emitting devices (H/P≤0.2, L/P>1, $I_{1/2}/I_0$>6, $I_{1/4}/I_0$=2.0, 2.1, 2.2, 2.3, 2.4, 2.5). The surface light source device including light-emitting device 200 (P110) according to the present embodiment and the surface light source devices including other light-emitting devices are different from each other in value of $I_{1/4}/I_0$. It can be said from these results that the luminance of a region near light-emitting device 40 on the light-emitting surface differs depending on the value of $I_{1/4}/I_0$. From the viewpoint of further equalizing the luminance distribution on the light-emitting surface, it is preferable that the luminance of the region near light-emitting device 40 is lower than the luminance of a portion immediately above light-emitting device 40.

Figure 24:
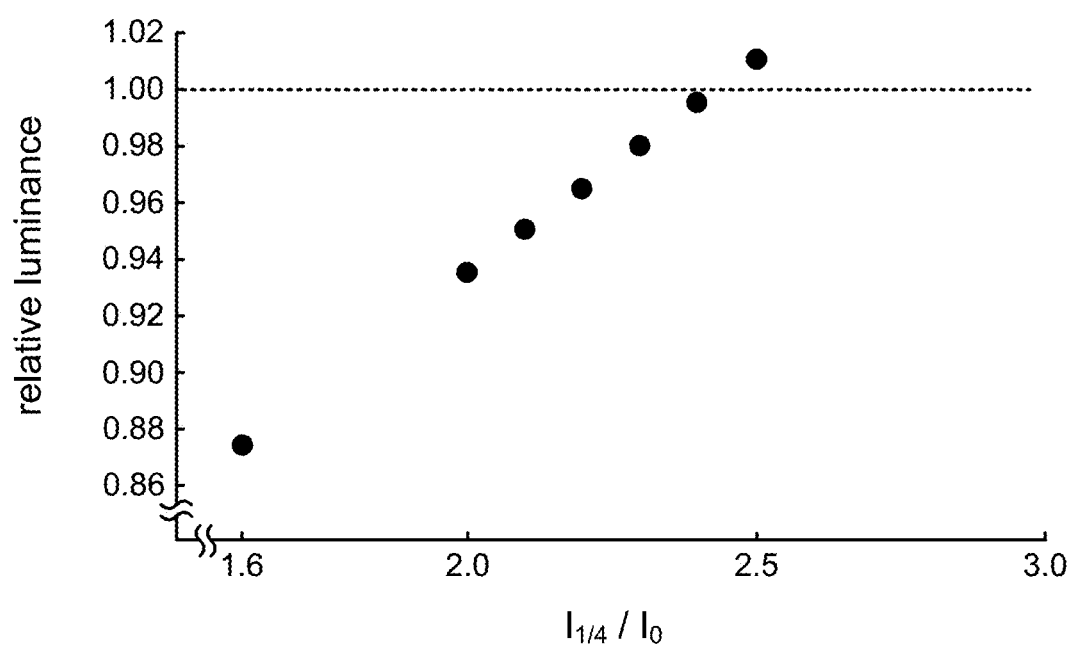
FIG. 24 is a graph illustrating a relationship between $I_{1/4}/I_0$ and a luminance in a region near the light-emitting device.

FIG. 24 is a graph illustrating a relationship between $I_{1/4}/I_0$ and a luminance near light-emitting device 40. The ordinate indicates relative values of the luminance at a point 18 mm from optical axis OA of light-emitting device 40 on the light-emitting surface (the peak point in the graph of FIG. 23A) in which the luminance of a point immediately above light-emitting device 40 on the light-emitting surface is set as 1. It can be said from this graph that in the case where $I_{1/4}/I_0$ is 2.4 or smaller, the luminance in the region near light-emitting device 40 is lower than the luminance of a portion immediately above light-emitting device 40. Accordingly, from the viewpoint of further equalizing the luminance distribution on the light-emitting surface, it is preferable that $I_{1/4}/I_0$ be 2.4 or smaller.

(Effect)

As described above, light flux controlling member 300 and surface light source device 100 according to the present embodiment include second incidence surface 324 that mainly allows incidence of light emitted from a side surface of light-emitting element 220 and refracts the light toward emission surface 330. Accordingly, light flux controlling member 300 and surface light source device 100 according to the present embodiment do not cause ring-shaped bright spot at a portion above light-emitting device 200, and can suppress luminance unevenness.

Likewise, surface light source device 100 and a display device including such a light flux controlling member 300 satisfy Expressions (2) to (5), and therefore can suppress luminance unevenness.

(Embodiment 2)

A display device according to Embodiment 2 is different from the display device according to Embodiment 1 in configuration of light flux controlling member 600. In view of this, the configurations similar to those of Embodiment 1 are denoted with the same reference numerals, and the description thereof will be omitted.

(Configuration of Light Flux Controlling Member)

Figure 25A:
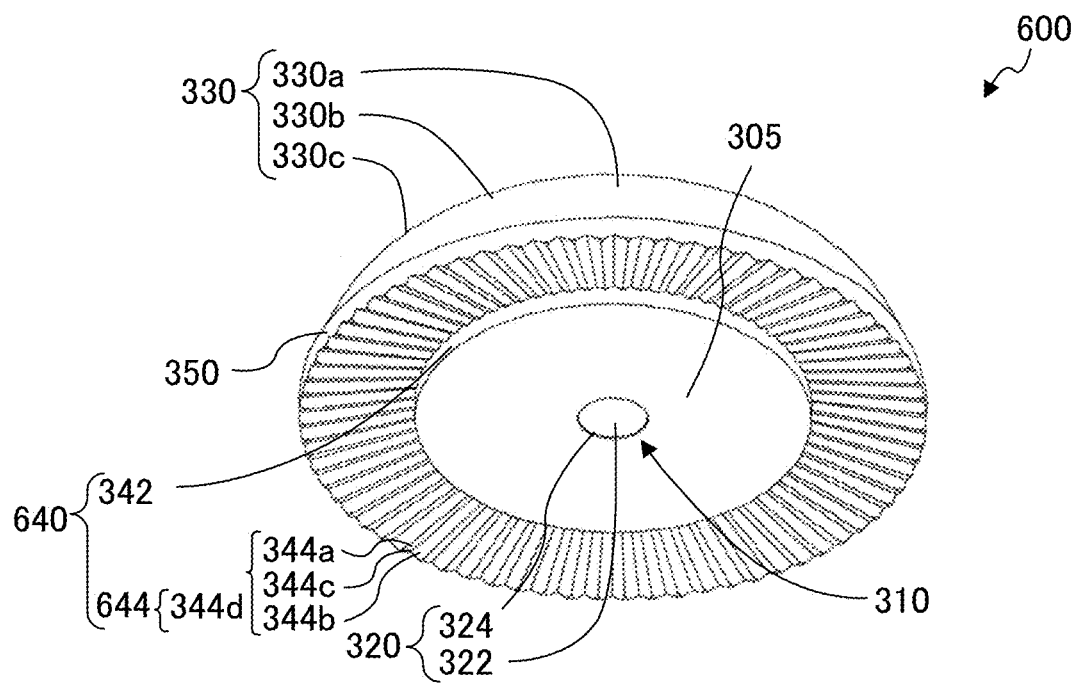
FIGS. 25A and 25B are perspective views of a light flux controlling member according to Embodiment 2 as viewed from a rear side.
Figure 25B:
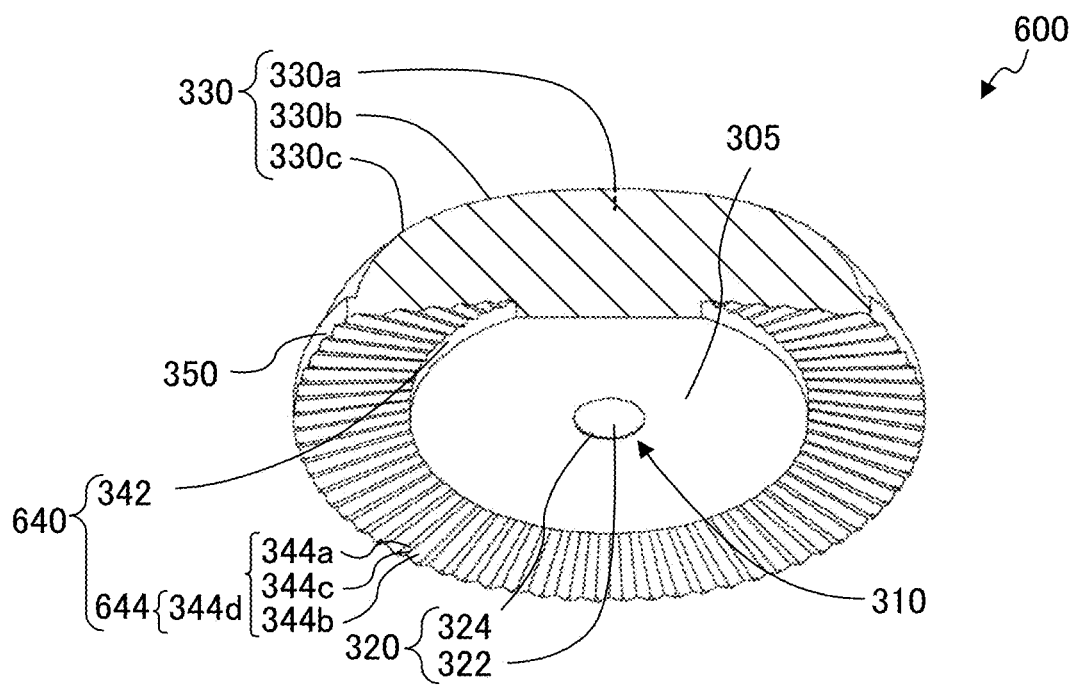

FIGS. 25A and 25B are perspective views of light flux controlling member 600 according to Embodiment 2 as viewed from a rear side. As illustrated in FIGS. 25A and 25B, light flux controlling member 600 in a display device according to Embodiment 2 includes incidence surface 320, emission surface 330, and second recess 640. In addition, light flux controlling member 600 according to the present embodiment includes flange part 350. Further, light flux controlling member 600 may include a leg part (omitted in the drawing).

Second recess 640 of light flux controlling member 600 according to Embodiment 2 includes inner inclined surface 342 and outer inclined surface 644. Outer inclined surface 644 is provided with a plurality of projections 344d.

Each protrusion 344d is formed in a substantially triangular shape in a cross section, and is rotationally symmetrical about (n-fold rotational symmetry where n is the number of protrusion 344d) central axis CA. Each protrusion 344d includes first inclined surface 344a having a planar shape, second inclined surface 344b having a planar shape, and third ridgeline 344c that is an intersection line of first inclined surface 344a and second inclined surface 344b. Each protrusion 344d functions as a total reflection prism. As illustrated in FIGS. 25A and 25B, in a cross section of light flux controlling member 600 including optical axis OA and third ridgeline 344c, optical axis OA and third virtual line VL3 including third ridgeline 344c intersect each other at a position remote from rear surface 305 relative to external inclined surface 644 in the light axis direction. That is, in each projection 344d, ridgeline 344c is tilted (for example, at 60 degrees) such that the distance thereof from central axis CA increases toward the rear surface.

(Light distribution characteristics of light-emitting device and surface light source device) The light distribution characteristics were measured with a light-emitting device including light flux controlling member 600 according to the present embodiment. Although not illustrated in the drawings, the light-emitting device including light flux controlling member 600 according to Embodiment 2 was capable of generating a greater quantity of light travelling toward a remote location in comparison with the light-emitting device according to Embodiment 1. In addition, in the light-emitting device including light flux controlling member 600 according to Embodiment 2, the formation of the ring-shaped bright spot at a portion immediately above the light-emitting device was suppressed as in light-emitting device 200 according to Embodiment 1. Further, in the surface light source device according to Embodiment 2, which satisfy Expression (2) to Expression (5), luminance unevenness was slight. The reason for this is that, with multiple projections 344*d* disposed in outer inclined surface 644, the surface light source device can further suppress luminance unevenness, which is caused when the light internally reflected by emission surface 330 is further reflected by substrate 210, and loss of light, which is caused when the light internally reflected by emission surface 330 is absorbed by substrate 210.

(Effect)

As described above, light flux controlling member 600 according to the present embodiment can provide an effect similar to that of Embodiment 1, or an effect greater than that of Embodiment 1. In addition, with multiple projections 344*d* that function as total reflection prisms, it is possible to further suppress luminance unevenness, which is caused when the light internally reflected by emission surface 330 is further reflected by substrate 210, and loss of light, which is caused when the light internally reflected by emission surface 330 is absorbed by substrate 210.

Figure 26A:
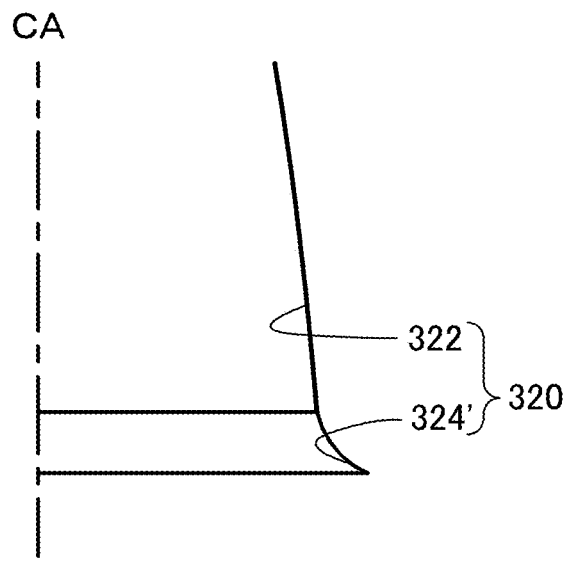
FIGS. 26A and 26B illustrate a shape of an incidence surface according to a modification.
Figure 26B:
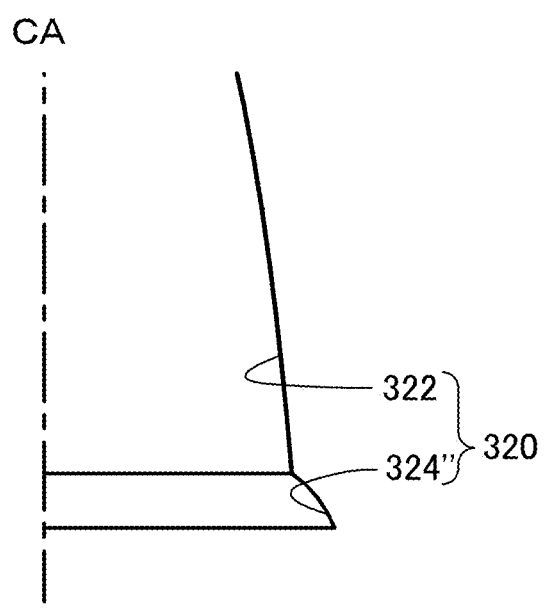

While the inclination angle of the tangent to second incidence surface 324 with respect to the first virtual line is constant in the above-described Embodiments 1 and 2, the inclination angle of the tangent to second incidence surface 324 with respect to the first virtual line is not limited as long as Expression (1) can be satisfied. For example, the inclination angle of the tangent to second incidence surface 324' with respect to the first virtual line may gradually decrease as illustrated in FIG. 26A. Alternatively, the inclination angle of the tangent to second incidence surface 324" with respect to the first virtual line may gradually increase as illustrated in FIG. 26B. Even with such configurations, the light incident on second incidence surface 324' or 324" does not directly reach second recess 340 or 640.

This application is entitled to and claims the benefit of Japanese Patent Application No. 2015-174013 filed on Sep. 3, 2015, and Japanese Patent Application No. 2015-199459 filed on Oct. 7, 2015 the disclosure each of which including the specification, drawings and abstract is incorporated herein by reference in its entirety.

INDUSTRIAL APPLICABILITY

The light flux controlling member, the light-emitting device and the surface light source device of the embodiments of the present invention are applicable to, for example, a backlight of liquid crystal display apparatuses or generally-used illumination apparatuses.

REFERENCE SIGNS LIST

10 Light-emitting element
20, 30 Light flux controlling member
22 Incidence surface
24 Emission surface
26 Rear surface
32 Inclined surface
34 Surface approximately parallel to central axis
40 Light-emitting device
100 Surface light source device
100' Surface light source device
110 Casing
112 Bottom plate
114 Top plate
120 Light diffusion plate
200 Light-emitting device
210 Substrate
220 Light-emitting element
300, 600 Light flux controlling member
305 Rear surface
310 First recess
320 Incidence surface
322 First incidence surface
324, 324', 324" Second incidence surface
330 Emission surface
330*a* First emission surface
330*b* Second emission surface
330*c* Third emission surface
340, 640 Second recess
342 Inner inclined surface
344, 644 Outer inclined surface
344*a* First inclined surface
344*b* Second inclined surface
344*c* Ridgeline
344*d* Projection
350 Flange part
CA Central axis of light flux controlling member
VL2 Second virtual line
VL3 Third virtual line
OA Optical axis of light-emitting element

The invention claimed is:

1. A light flux controlling member that controls a distribution of light emitted from a light-emitting element, the light flux controlling member comprising:
   an incidence surface that is an inner surface of a first recess, the first recess being disposed on a rear side of the light flux controlling member so as to intersect a central axis of the light flux controlling member, the incidence surface being configured to allow incidence of light emitted from the light-emitting element;
   an emission surface disposed on a front side of the light flux controlling member so as to intersect the central axis, the emission surface being configured to emit, to outside, light incident on the incidence surface; and
   a second recess disposed on the rear side so as to surround the incidence surface, wherein:
   the incidence surface includes:
   a first incidence surface disposed so as to intersect the central axis, and
   a second incidence surface disposed so as to connect an outer edge of the first incidence surface and an opening edge of the first recess,
   in a cross section including the central axis, an intersection of the first incidence surface and the second incidence surface is disposed on the central axis side relative to the opening edge of the first recess,
   in the cross-section, an inclination angle of a tangent to an end portion of the second incidence surface on the first incidence surface side with respect to a first virtual line that is orthogonal to the central axis is smaller than an inclination angle of a tangent to an end portion of the first incidence surface on the second incidence surface side with respect to the first virtual line,
   in the cross-section, the inclination angle of the tangent to the second incidence surface with respect to the first virtual line gradually decreases from the outer edge of the first incidence surface toward the opening edge of the first recess, and the light flux controlling member satisfies Expression (1) as follows:

[Expression 1]

$$h1 < h2 + d \times \cot(\theta1 + \theta2) \tag{1}$$

wherein:
h1 represents a distance between an apex of the second recess and a second virtual line that is orthogonal to the central axis and passes through the opening edge of the first recess in the cross-section,
h2 represents a distance between the second virtual line and an incident position of light which is emitted from the light-emitting element and is incident on the second incidence surface in the cross-section,
d represents a distance between the incident position and the apex of the second recess in a direction orthogonal to the central axis in the cross-section,
θ1 represents a refraction angle of the light incident on the incident position, and
θ2 represents an inclination angle of a tangent to the incident position with respect to the second virtual line in the cross-section.

2. The light flux controlling member according to claim 1, wherein:
the second recess includes:
an inner inclined surface disposed on the central axis side, and
an outer inclined surface disposed on a side remote from the central axis relative to the inner inclined surface; and
in the cross-section, the outer inclined surface is tilted in such a manner that a distance of the outer inclined surface from the central axis increases toward the rear surface side.

3. The light flux controlling member according to claim 2, wherein:
a plurality of projections are disposed in the outer inclined surface, each of the plurality of projections having a nearly triangular shape in a cross section perpendicular to the central axis;
each of the plurality of projections includes a first inclined surface, a second inclined surface, and a ridgeline as an intersection line of the first inclined surface and the second inclined surface;
the plurality of projections are disposed in such a manner that the plurality of projections are rotationally symmetrical about the central axis; and
the ridgeline is tilted such that a distance of the ridgeline from the central axis increases toward the rear surface side.

4. A light-emitting device comprising:
a light-emitting element; and
the light flux controlling member according to claim 1, wherein
the light flux controlling member is disposed at a position where the central axis coincides with an optical axis of the light-emitting element.

5. The light-emitting device according to claim 4, wherein the light-emitting element is a light-emitting diode (LED) of a chip-on-board (COB) type.

6. A surface light source device comprising:
a substrate;
a plurality of the light-emitting devices according to claim 1 that are disposed on the substrate at a predetermined interval; and
a light diffusion plate disposed in approximately parallel with the substrate at a position above the plurality of light-emitting devices, the light diffusion plate being configured to allow light from the plurality of light-emitting devices to pass through the light diffusion plate while diffusing the light, wherein:
in an angle range from a direction along the optical axis to a direction in which light having a highest luminous intensity is emitted from each of the plurality of light-emitting devices, a luminous intensity of light from the each of the plurality of light-emitting devices gradually increases as an angle to the optical axis increases, and
the surface light source device satisfies Expression (2), Expression (3), and Expression (4), as follows:

[Expression 2]

$$\frac{H}{P} \leq 0.2 \tag{2}$$

[Expression 3]

$$\frac{L}{P} > 1 \tag{3}$$

[Expression 4]

$$\frac{I_{1/2}}{I_0} > 6 \tag{4}$$

wherein;
P represents a center-to-center distance of the plurality of light-emitting devices,
H represents a distance between a top surface of the substrate and a bottom surface of the light diffusion plate,
L represents a distance between an arrival point of the light having the highest luminous intensity on the bottom surface of the light diffusion plate, and an intersection of the optical axis and the bottom surface of the light diffusion plate,
$I_0$ represents a luminous intensity of light emitted from the each of the plurality light-emitting devices in a direction of the light axis, and
$I_{1/2}$ represents a luminous intensity of light emitted from the each of the plurality light-emitting devices toward a point, on the bottom surface of the light diffusion plate, distanced by P/2 from the intersection of the optical axis and the bottom surface of the light diffusion plate.

7. A display device comprising:
the surface light source device according to claim 6; and
an illumination member configured to be irradiated with light emitted from the surface light source device.

* * * * *